(12) United States Patent
Deumel et al.

(10) Patent No.: US 11,581,359 B2
(45) Date of Patent: Feb. 14, 2023

(54) MULTIPLE SPECTRAL DETECTORS USING STRUCTURED PEROVSKITE

(71) Applicant: Siemens Healthcare GmbH, Erlangen (DE)

(72) Inventors: Sarah Deumel, Erlangen-Sieglitzhof (DE); Sandro Francesco Tedde, Weisendorf (DE); Judith Elisabeth Huerdler, Nuremberg (DE)

(73) Assignee: SIEMENS HEALTHCARE GMBH, Erlangen (DE)

( * ) Notice: Subject to any disclaimer, the term of this patent is extended or adjusted under 35 U.S.C. 154(b) by 119 days.

(21) Appl. No.: 17/159,267

(22) Filed: Jan. 27, 2021

(65) Prior Publication Data

US 2021/0242273 A1 Aug. 5, 2021

(30) Foreign Application Priority Data

Feb. 4, 2020 (EP) .................................. 20155405

(51) Int. Cl.
| | | |
|---|---|---|
| *H01L 27/146* | (2006.01) | |
| *H01L 27/32* | (2006.01) | |
| *G01T 1/20* | (2006.01) | |

(52) U.S. Cl.
CPC .... *H01L 27/14663* (2013.01); *G01T 1/20185* (2020.05); *H01L 27/14683* (2013.01)

(58) Field of Classification Search
CPC ......... H01L 27/14663; H01L 27/14683; H01L 27/14632; H01L 27/14687; H01L 27/1463;

(Continued)

(56) References Cited

U.S. PATENT DOCUMENTS

| 5,132,541 A | 7/1992 | Conrads et al. |
| 8,488,736 B2 | 7/2013 | Hoffman et al. |

(Continued)

FOREIGN PATENT DOCUMENTS

| CN | 109088003 A | 12/2018 |
| DE | 102009040627 B4 | 8/2017 |

(Continued)

OTHER PUBLICATIONS

Li, C. et. al., "Methylamine gas based synthesis and healing process toward upscaling of perovskite solar cells: Progress and perspective", Solar RRL, 1(9), 1700076, 2017.

(Continued)

*Primary Examiner* — David Vu
(74) *Attorney, Agent, or Firm* — Harness, Dickey & Pierce, P.L.C.

(57) ABSTRACT

A detector for electromagnetic radiation is disclosed. The detector includes: a first electrode layer including at least one first electrode pixel and a second electrode pixel. A second electrode and a first layer including at least one first perovskite are situated between the at least one first electrode pixel of the first electrode layer and the second electrode. Further, a second layer including at least one second different perovskite, is situated between the second electrode pixel of the first electrode layer and the second electrode. In another embodiment, a detector for electromagnetic radiation is disclosed where a first layer including at least one first perovskite, is situated between the at least one first electrode pixel of the first electrode layer and the second electrode, and between the second electrode pixel of the first electrode layer and the second electrode. A method for the production is also disclosed.

20 Claims, 14 Drawing Sheets

(58) Field of Classification Search
CPC ............. H01L 27/3248; H01L 27/3246; H01L 51/5203; H01L 51/56
See application file for complete search history.

(56) References Cited

U.S. PATENT DOCUMENTS

| | | | |
|---|---|---|---|
| 10,453,763 | B2 | 10/2019 | Barber et al. |
| 10,573,690 | B2 * | 2/2020 | Lifka .................. H01L 51/0003 |
| 2013/0001768 | A1 | 1/2013 | Nikitin |
| 2014/0264955 | A1 | 9/2014 | Feyh et al. |
| 2017/0293037 | A1 | 10/2017 | Schmidt et al. |
| 2017/0322323 | A1 | 11/2017 | Fischer et al. |
| 2018/0269235 | A1 | 9/2018 | Kim |
| 2018/0277608 | A1 | 9/2018 | Lifka et al. |
| 2018/0286923 | A1 | 10/2018 | Fischer et al. |
| 2018/0294106 | A1 | 10/2018 | Qi et al. |
| 2019/0074326 | A1 | 3/2019 | Yu et al. |
| 2019/0123110 | A1 | 4/2019 | Fischer et al. |
| 2019/0162865 | A1 | 5/2019 | Huang et al. |
| 2021/0239859 | A1 | 8/2021 | Deumel et al. |
| 2021/0242273 | A1 | 8/2021 | Deumel et al. |

FOREIGN PATENT DOCUMENTS

| | | | |
|---|---|---|---|
| DE | 102016205818 | A1 | 10/2017 |
| EP | 2973688 | B1 | 5/2018 |
| EP | 3376260 | A1 | 9/2018 |
| EP | 3379592 | A1 | 9/2018 |
| EP | 3474339 | A1 | 4/2019 |
| EP | 3304611 | B1 | 9/2019 |
| EP | 3863059 | A1 | 8/2021 |
| WO | WO-2016091442 | A1 | 6/2016 |
| WO | WO-2016091600 | A1 | 6/2016 |
| WO | WO 2016203724 | A1 | 12/2016 |
| WO | WO-2018009712 | A2 | 1/2018 |

OTHER PUBLICATIONS

Del Campo, A. et. al., "SU-8: a photoresist for high-aspect-ratio and 3D submicron lithography", J. Microchem. Microeng. 17, R81-R95, 2007.
Pacella, D., "Energy-resolved X-ray detectors: the future of diagnostic imaging", Reports in Medical Imaging, pp. 1-13, 2015.
Kain, A. et. al., "High aspect ratio- and 3D-printing of freestanding so-phisticated structures", Procedie Chemistry 1, pp. 750-753, DOI: 10.1016/j.proche.2009.07.187, 2009.
Loechel, B., Thick-layer resists for surface micromachining, J. Micromech. Microeng. 10, pp. 108-115, 2000.
Tokarev, V. N., et. al., "High-aspect-ratio microdrilling of polymers with UV laser ablation: experiment with analytical model", Appl. Phys. A, DOI: 10.1007/s00339-002-1511-8, 2002.
Sytnyk, M., et. al., "The bright future of metal halide perovskites for X-ray detection", 2019.
Sytnyk, Mykhailo et al; "A Perspective on the bright future of metal halide perovskites for X-ray detection"; Applied Physics Letters; vol. 115; No. 19; XP012241906; DOI: 10.1063; 2019.
Zahn, J. D. et. al., "A direct plasma etch approach to high aspect ratio polymer micromachining with applications in biomems and CMOS-mems", Technical Digest. MEMS, Fifteenth IEEE International Conference on Micro Electro Mechanical Systems, DOI: 10.1109/MEMSYS.2002.984223, 2002.
European Office Action dated Jun. 18, 2020.
Office action dated Mar. 8, 2022 for corresponding U.S. Appl. No. 17/159,272.
Wei, Haotong et al. "Sensitive X-ray detectors made of methylammonium lead tribromide perovskite single crystals" Nature Photon I CS, Mar. 2016, pp. 333-335, DOI: 10.1038/NPHOTON.2016.41.
Shrestha, Shreetu et al. "High-performance direct conversion X-ray detectors based on sintered hybrid lead triiodide perovskite wafers" Nature Photonics, Jun. 2017 DOI: 10.1038/NPHOTON.2017.94.
Yakunin, Sergii et al. "Detection of X-ray photons by solution-processed lead halide perovskites" Nature Photonics, May 2015; pp. 1-18; ISSN 1749-4885.
European Office Action dated Jul. 27, 2020.

* cited by examiner

MULTIPLE SPECTRAL DETECTORS USING STRUCTURED PEROVSKITE

PRIORITY STATEMENT

The present application hereby claims priority under 35 U.S.C. § 119 to European patent application number EP20155405.2 filed Feb. 4, 2020, the entire contents of which are hereby incorporated herein by reference.

FIELD

An example embodiment of the application generally relates to a detector for electromagnetic radiation, comprising: a first electrode layer comprising at least one first electrode pixel and a second electrode pixel, a second electrode and a first layer comprising at least one first perovskite which is situated between the first electrode pixel of the first electrode layer and the second electrode, and a second layer comprising at least one second perovskite different from the first perovskite, which is situated between the second electrode pixel of the first electrode layer and the second electrode; a detector for electromagnetic radiation, comprising: a first electrode layer comprising at least one first electrode pixel and a second electrode pixel, a second electrode and a first layer comprising at least one first perovskite, which is situated between the first electrode pixel of the first electrode layer and the second electrode and between the second electrode pixel of the first electrode layer and the second electrode, and a method for the production thereof.

BACKGROUND

X-ray detectors and gamma radiation detectors/gamma detectors are used in many fields. In conventional X-ray detectors, the maximum and average energy of the X-ray photons are selected dependent upon the transirradiated object. For example, in industrial production, X-ray radiation is used for testing materials by way of non-destructive testing (NDT), wherein X-ray radiation with energies of a few megaelectronvolts (MeV) can be used.

An important part is also played by X-ray detectors in medical diagnostics, wherein the energies of the X-ray radiation used are typically in a range of approximately 20 to 120 kiloelectronvolts (keV). The examined substances typically have different X-ray absorption spectra. Thus, for example, the absorbing power of bones, soft tissues or tissue in different energy ranges differ significantly from one another. In order not to expose the patients to excessive and unnecessary radiation loading, the dose of the X-ray radiation is typically selected so that the X-ray image is optimized for structures of a particular category, for instance, bones or soft tissues. The energy of the X-ray radiation used is therefore selected to be in the range which is particularly strongly absorbed by the structure to be investigated.

All these X-ray detectors are based upon the integration of the generated charge carriers independently of the energy of the photon that has generated them. This enables the absorption properties to be determined in a pixel-by-pixel manner, but does not yield spectral information.

It is, however, often also necessary to obtain information regarding the overall composition of the object being irradiated, in particular, the spectral composition.

Spectral information in X-ray images is obtainable, for example, with counting detectors (e.g. based upon cadmium telluride, CdTe or cadmium zinc telluride CdZnTe), which have dedicated and complex (expensive) control and readout electronics.

Currently, manufacturing of spectrally resolving detectors is complex and expensive. Furthermore, they are not easily scalable in area (e.g. in the case of CdTe).

In order to obtain detailed information, for example, from a patient or an object from an image recorded via X-ray or gamma radiation, concerning the composition of the materials (in the case of patients, e.g. distinguishing soft tissues and bones or recognizing particular biomarkers), further different approaches exist. In order to detect both bone as well as tissue, X-ray radiation in different energy regions can be used. In the so-called dual energy X-ray absorptiometry (DEXA), two different recordings are made with different X-ray energies. The two X-ray images that have been recorded with different X-ray spectra can be compared and a dual-energy image can be calculated.

For this purpose, either two images can be recorded successively with one X-ray tube or, in a tomograph, images can be recorded with two different X-ray tubes with different emission spectra. The former is dependent upon the movement of the patient between the two recorded images (movement artifacts), but does not need additional X-ray tubes. Where a good image resolution is required, the first variant is normally not usable in practice (movement artifacts). Another approach consists of a detector having different layers. Each layer is sensitive to a different energy. For this purpose, a layering of two or more scintillators with a filter, for example, in the middle, is often selected.

For example, it is usual to stack a plurality of detectors, wherein for example, the uppermost detector can serve as a filter (hardening the radiation) for the lower-lying detector(s). Such an arrangement of a plurality of detectors, each with different energy regions is known, for example, from U.S. Pat. No. 8,488,736 B2. Through a combination of the images, it can be prevented that the X-ray images have overexposed or underexposed parts.

Through the stacking of detectors, it is possible with a single X-ray source which emits X-ray radiation in different energy ranges to create images on the basis of the radiation transmitted in the respective energy ranges. For this purpose, however, a large number of respectively independent detectors is needed.

Relatively new detector materials make use of the property of "photon counting" with which information regarding the energy of the incident photons can also be generated (cf. D. Pacella: Energy-Resolved X-Ray Detectors: The Future of Diagnostic Imaging, 2015).

The approaches mentioned have in common that they must be manufactured in an expensive and complex manner with a view to a good image resolution: either a second X-ray tube must be installed in the tomograph, a layering of different scintillator and filter materials matched to one another must be combined in one detector, or the resolution of the detector must be high enough so that the counting of individual photons is possible.

In the publication by M. Sytnyk, "The Bright Future of Metal Halide Perovskites for X-Ray Detection", Appl. Phys. Lett. 115, 2019, DOI: 10.1063/1.5125999, the approach of the combination of a plurality of scintillator layers in a detector was taken and further formulated in the form of a thought experiment. M. Sytnyk et al. combine four different scintillating perovskite nanocrystals which emit visible photons in different wavelengths and simultaneously function as a filter for layers lying thereunder. The absorption by these nanocrystals is dependent upon the incident X-ray radiation.

The spectral information is resolved again via a hyperspectral camera (not scalable in area), or via the use of color filters (not without massive conversion losses).

SUMMARY

Accordingly, the inventors have discovered that a multi-layer structure of a corresponding detector also entails difficulties in the adhesion between the individual layers and can possibly also cause further problems, for example, in the adaptation of the crystal structure to the preceding layer. Thus, the inventors have discovered that a need exists for multispectral detectors which can be manufactured easily and are distinguished by good adhesion and stability.

The inventors have discovered that by way of a structuring of the individual electrode pixels of a detector comprising a pixelated electrode and either the use of different perovskites and/or different filling heights of perovskite for detection, a multispectral detector with good adhesion of the detection layers and good stability can be obtained. Embodiments of the present invention relate accordingly to detectors, in particular, direct or indirect X-ray and/or gamma-ray detectors which use one or more structured perovskites as the absorber material. Through the combination of different perovskites and/or different heights/crystal structures of a perovskite, different energies of photons can be detected, so that more information regarding the irradiated objects can be generated.

In a first embodiment, the present invention relates to a detector for electromagnetic radiation, in particular, an X-ray and/or gamma detector, comprising:
  a first electrode layer comprising at least one first electrode pixel and a second electrode pixel as well as an intermediate space between the first electrode pixel and the second electrode pixel,
  a second electrode,
  a first layer comprising at least one first perovskite which is situated between the first electrode pixel of the first electrode layer and the second electrode, and
  a second layer comprising at least one second perovskite different from the first perovskite which is situated between the second electrode pixel of the first electrode layer and the second electrode,
further comprising a structure which is situated at least partially between the first electrode layer and the second electrode and is arranged between the first electrode pixel and the second electrode pixel of the first electrode layer such that it is arranged at least partially on the intermediate space between the first electrode pixel and the second electrode pixel in the direction of the second electrode remote from the first electrode layer, wherein the first layer comprising at least one first perovskite is at least partially introduced into the structure in a first region such that it is situated over the first electrode pixel of the first electrode layer, and wherein the second layer comprising at least one second perovskite is introduced at least partially into the structure in a second region such that it is situated over the second electrode pixel of the first electrode layer, wherein the structure separates the first and the second region.

A second embodiment of the present invention is directed to a detector for electromagnetic radiation, in particular, an X-ray and/or gamma detector, comprising:
  a first electrode layer comprising at least one first electrode pixel and a second electrode pixel as well as an intermediate space between the first electrode pixel and the second electrode pixel,
  a second electrode,
  a first layer comprising at least one first perovskite which is situated between the first electrode pixel of the first electrode layer and the second electrode, and between the second electrode pixel of the first electrode layer and the second electrode,
further comprising a structure which is situated at least partially between the first electrode layer and the second electrode and is arranged between the first electrode pixel and the second electrode pixel of the first electrode layer such that it is arranged at least partially on the intermediate space between the first electrode pixel and the second electrode pixel in the direction of the second electrode remote from the first electrode layer, wherein the first layer comprising at least one first perovskite is at least partially introduced into the structure such that it is situated over the first electrode pixel of the first electrode layer in a first region and over the second electrode pixel of the first electrode layer in a second region, wherein
  a first filling height of the first layer comprising at least one first perovskite over the first electrode pixel in the first region differs from a second filling height of the first layer over the second electrode pixel in the second region, wherein the structure separates the first and the second region.

In a third embodiment, a method for producing a detector for electromagnetic radiation, in particular, an X-ray or gamma detector, is disclosed, comprising:
  providing a first electrode layer comprising at least one first electrode pixel and a second electrode pixel as well as an intermediate space between the first electrode pixel and the second electrode pixel,
  applying a structure at least partially onto the intermediate space of the first electrode layer, wherein the structure is applied such that the structure is arranged on the intermediate space remote from the first electrode layer, wherein the structure separates a first region over the first electrode pixel from a second region over the second electrode pixel;
  introducing into the structure a first layer comprising at least one first perovskite and a second layer comprising at least one second perovskite different from the first perovskite, wherein the first layer comprising at least one first perovskite is at least partially introduced into the structure such that it is situated over the first electrode pixel of the first electrode layer in the first region, and wherein the second layer comprising at least one second perovskite is introduced at least partially into the structure such that it is situated over the second electrode pixel of the first electrode layer in the second region; and
  applying a second electrode onto the structure and/or the first layer comprising at least one first perovskite and/or the second layer comprising at least one second perovskite; or
  providing a structure, wherein the structure has at least one intermediate space;
  introducing a first electrode pixel and a second electrode pixel onto different sides of the intermediate space of the structure, wherein the first electrode pixel and the second electrode pixel do not fill the structure, and thereby forming a first electrode layer, wherein the structure separates a first region over the first electrode pixel and a second region over the second electrode pixel;
  introducing into the structure a first layer comprising at least one first perovskite and a second layer comprising at least one second perovskite different from the first perovskite, wherein the first layer comprising at least one first perovskite is at least partially introduced into the structure such that it is situated over the first electrode pixel of the first electrode layer in the first region, and wherein the second layer comprising at least one second perovskite is introduced at least partially into the structure such that it is situated over the second electrode pixel of the first electrode layer in the second region; and applying a second electrode onto the structure and/or the first layer comprising at least one first perovskite and/or the second layer comprising at least one second perovskite.

A fourth embodiment of the present invention relates to a method for producing a detector for electromagnetic radiation, in particular, an X-ray and/or gamma detector, comprising:

providing a first electrode layer comprising at least one first electrode pixel and a second electrode pixel as well as an intermediate space between the first electrode pixel and the second electrode pixel, applying a structure at least partially onto the intermediate space of the first electrode layer, wherein the structure is applied such that the structure is arranged on the intermediate space remote from the first electrode layer, wherein the structure separates a first region over the first electrode pixel from a second region over the second electrode pixel;

introducing at least partially into the structure a first layer comprising at least one first perovskite such that it is situated over the first electrode pixel of the first electrode layer in the first region and over the second electrode pixel of the first electrode layer in the second region, wherein a first filling height of the first layer comprising at least one first perovskite over the first electrode pixel in the first region differs from a second filling height of the first layer over the second electrode pixel in the second region; and applying a second electrode onto the structure and/or the first layer comprising at least one first perovskite; or providing a structure, wherein the structure has at least one intermediate space;

introducing a first electrode pixel and a second electrode pixel onto different sides of the intermediate space of the structure, wherein the first electrode pixel and the second electrode pixel do not fill the structure, and thereby forming a first electrode layer, wherein the structure separates a first region over the first electrode pixel and a second region over the second electrode pixel;

introducing at least partially into the structure a first layer comprising at least one first perovskite such that it is situated over the first electrode pixel of the first electrode layer in the first region and over the second electrode pixel of the first electrode layer in the second region, wherein a first filling height of the first layer comprising at least one first perovskite over the first electrode pixel in the first region differs from a second filling height of the first layer over the second electrode pixel in the second region; and applying a second electrode onto the structure and/or the first layer comprising at least one first perovskite.

An embodiment is directed to a detector for electromagnetic radiation, comprising:

a first electrode layer including at least one first electrode pixel and a second electrode pixel, an intermediate space existing between the at least one first electrode pixel and the second electrode pixel;

a second electrode;

a first layer including at least one first perovskite, situated between the at least one first electrode pixel of the first electrode layer and the second electrode;

a second layer including at least one second perovskite, different from the at least one first perovskite, situated between the second electrode pixel of the first electrode layer and the second electrode; and a structure, situated at least partially between the first electrode layer and the second electrode, and arranged between the at least one first electrode pixel and the second electrode pixel of the first electrode layer so as to be arranged at least partially in the intermediate space between the at least one first electrode pixel and the second electrode pixel in a direction of the second electrode remote from the first electrode layer, wherein the first layer including the at least one first perovskite is at least partially introduced into the structure in a first region so as to be situated over the at least one first electrode pixel of the first electrode layer, wherein the second layer including the at least one second perovskite is introduced at least partially into the structure in a second region so as to be situated over the second electrode pixel of the first electrode layer, and wherein the structure separates the first region and the second region.

An embodiment is directed to a detector for electromagnetic radiation, comprising:

a first electrode layer including at least one first electrode pixel and a second electrode pixel, an intermediate space existing between the at least one first electrode pixel and the second electrode pixel;

a second electrode;

a first layer including at least one first perovskite, situated between the at least one first electrode pixel of the first electrode layer and the second electrode, and between the second electrode pixel of the first electrode layer and the second electrode; and a structure, situated at least partially between the first electrode layer and the second electrode and arranged between the at least one first electrode pixel and the second electrode pixel of the first electrode layer so as to be arranged at least partially in the intermediate space between the at least one first electrode pixel and the second electrode pixel in the direction of the second electrode remote from the first electrode layer, wherein the first layer including at least one first perovskite is at least partially introduced into the structure so as to be situated over the at least one first electrode pixel of the first electrode layer in a first region and over the second electrode pixel of the first electrode layer in a second region, wherein a first filling height, of the first layer including the at least one first perovskite over the at least one first electrode pixel in the first region, differs from a second filling height, of the first layer over the second electrode pixel in the second region, and wherein the structure separates the first and the second region.

An embodiment is directed to a method for producing a detector for electromagnetic radiation, comprising:

providing a first electrode layer including at least one first electrode pixel and a second electrode pixel, an intermediate space existing between the at least one first electrode pixel and the second electrode pixel;

applying a structure at least partially onto the intermediate space of the first electrode layer, the structure being applied such that the structure is arranged on the intermediate space remote from the first electrode layer, and the structure separating a first region over the at least one first electrode pixel from a second region over the second electrode pixel;

introducing into the structure, a first layer including at least one first perovskite and a second layer including at least one second perovskite different from the first perovskite, the first layer including the at least one first perovskite being at least partially introduced into the structure so as to be situated over the at least one first electrode pixel of the first electrode layer in the first region, and the second layer including at least one second perovskite being introduced at least partially into the structure so as to be situated over the second electrode pixel of the first electrode layer in the second region; and applying a second electrode onto at least one of the structure, the first layer including the at least one first perovskite and the second layer including the at least one second perovskite; or providing a structure, the structure including at least one intermediate space;

introducing a first electrode pixel and a second electrode pixel onto different sides of the intermediate space of the structure, wherein the first electrode pixel and the second electrode pixel do not fill the structure, and thereby forming a first electrode layer, wherein the structure separates a first region over the first electrode pixel and a second region over the second electrode pixel;

introducing into the structure, a first layer including at least one first perovskite and a second layer including at least one second perovskite, different from the first perovskite, the first layer including at least one first perovskite being at least partially introduced into the structure so as to be situated over the at least one first electrode pixel of the first electrode layer in the first region, and the second layer including at least one second perovskite being introduced at least partially into the structure so as to be situated over the second electrode pixel of the first electrode layer in the second region; and applying a second electrode onto at least one of the structure, the first layer including the at least one first perovskite and the second layer including the at least one second perovskite.

An embodiment is directed to a method for producing a detector for electromagnetic radiation, comprising:

providing a first electrode layer including at least one first electrode pixel and a second electrode pixel, an intermediate space existing between the at least one first electrode pixel and the second electrode pixel;

applying a structure at least partially onto the intermediate space of the first electrode layer, the structure being applied such that the structure is arranged in the intermediate space remote from the first electrode layer, and the structure separating a first region over the at least one first electrode pixel from a second region over the second electrode pixel;

introducing at least partially into the structure, a first layer including the at least one first perovskite, so as to be situated over the at least one first electrode pixel of the first electrode layer in the first region and over the second electrode pixel of the first electrode layer in the second region, a first filling height of the first layer, including the at least one first perovskite, over the at least one first electrode pixel in the first region, differing from a second filling height of the first layer over the second electrode pixel in the second region; and applying a second electrode onto at least one of the structure and the first layer including the at least one first perovskite; or providing a structure, the structure including at least one intermediate space;

introducing a first electrode pixel and a second electrode pixel onto different sides of the intermediate space of the structure, wherein the first electrode pixel and the second electrode pixel do not fill the structure, and thereby forming a first electrode layer, the structure separating a first region over the first electrode pixel and a second region over the second electrode pixel;

introducing at least partially into the structure a first layer including at least one first perovskite so as to be situated over the at least one first electrode pixel of the first electrode layer in the first region and over the second electrode pixel of the first electrode layer in the second region, a first filling height of the first layer, including the at least one first perovskite, over the first electrode pixel in the first region, differs from a second filling height of the first layer over the second electrode pixel in the second region; and applying a second electrode onto at least one of the structure and the first layer including at least one first perovskite.

Further embodiments of the present invention are contained in the claims and the detailed description.

BRIEF DESCRIPTION OF THE DRAWINGS

The accompanying drawings are intended to illustrate embodiments of the present invention and to impart further understanding thereof. Together with the description, they serve to elucidate concepts and principles of the invention. Other embodiments and many of the stated advantages are disclosed with reference to the drawings. The elements of the drawings are not necessarily shown in correct scale to one another. Identical, functionally similar and similarly acting elements, features and components are provided in the drawings with the same reference signs in each case, unless otherwise stated.

Figure 1:
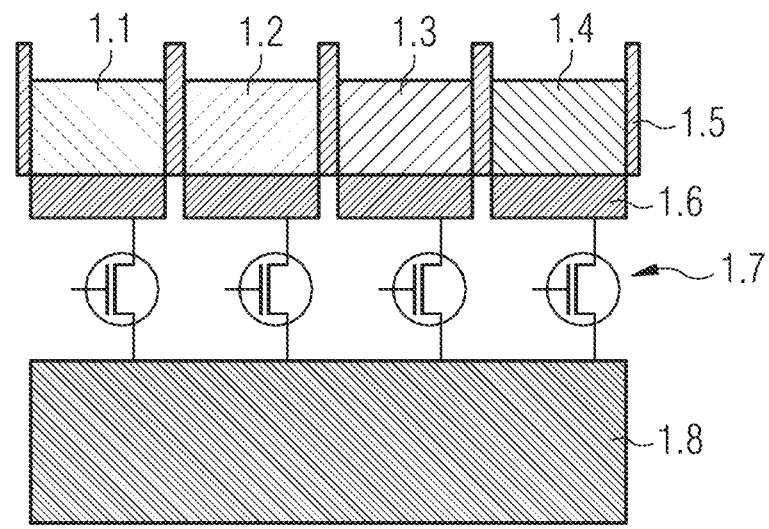
FIG. 1 shows a schematic representation of an example detector of the first embodiment according to the invention.

If not otherwise defined, technical and scientific expressions used herein have the same meaning as is understood by a person skilled in the art in the specialist field of embodiments of the invention.

Quantity specifications given in the context of embodiments of the present invention relate to percent by weight if not otherwise stated or if obvious from the context.

DETAILED DESCRIPTION OF THE EXAMPLE EMBODIMENTS

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. At least one embodiment of the present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuity such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (procesor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

A first embodiment of the present invention relates to a detector for electromagnetic radiation, in particular an X-ray and/or gamma detector, comprising:
  a first electrode layer comprising at least one first electrode pixel and a second electrode pixel as well as an intermediate space between the first electrode pixel and the second electrode pixel,
  a second electrode,
  a first layer comprising at least one first perovskite which is situated between the first electrode pixel of the first electrode layer and the second electrode, and
  a second layer comprising at least one second perovskite different from the first perovskite, which is situated between the second electrode pixel of the first electrode layer and the second electrode,
  further comprising a structure which is situated at least partially between the first electrode layer and the second electrode and is arranged between the first electrode pixel and the second electrode pixel of the first electrode layer such that it is arranged at least partially on the intermediate space between the first electrode pixel and the second electrode pixel in the direction of the second electrode remote from the first electrode layer, wherein the first layer comprising at least one first perovskite is at least partially introduced into the structure in a first region such that it is situated over the first electrode pixel of the first electrode layer, and wherein the second layer comprising at least one second perovskite is introduced at least partially into the structure in a second region such that it is situated over the second electrode pixel of the first electrode layer, wherein the structure separates the first and the second region.

According to particular embodiments of the detector of the first embodiment, the at least one first perovskite in the first layer comprising at least one first perovskite and/or the at least one second perovskite in the second layer is at least partially recrystallized. In addition, according to particular embodiments of the detector of the first embodiment, a first filling height of the first layer comprising at least one first perovskite over the first electrode pixel in the first region can also differ from a second filling height of the second layer over the second electrode pixel in the second region, as in the detector of the second embodiment, that is, a mixed form of the detector of the first embodiment and the detector of the second embodiment. Accordingly, descriptions relating to different filling heights with regard to the detector of the second embodiment are also applicable accordingly to different embodiments of the detector of the first embodiment.

A second embodiment of the present invention relates to a detector for electromagnetic radiation, in particular an X-ray and/or gamma detector, comprising:
  a first electrode layer comprising at least one first electrode pixel and a second electrode pixel as well as an intermediate space between the first electrode pixel and the second electrode pixel,
  a second electrode,
  a first layer comprising at least one first perovskite which is situated between the first electrode pixel of the first electrode layer and the second electrode, and between the second electrode pixel of the first electrode layer and the second electrode,
  further comprising a structure which is situated at least partially between the first electrode layer and the second electrode and is arranged between the first electrode pixel and the second electrode pixel of the first electrode layer such that it is arranged at least partially on the intermediate space between the first electrode pixel and the second electrode pixel in the direction of the second electrode remote from the first electrode layer, wherein the first layer comprising at least one first perovskite is at least partially introduced into the structure such that it is situated over the first electrode pixel of the first electrode layer in a first region and over the second electrode pixel of the first electrode layer in a second region, wherein a first filling height of the first layer comprising at least one first perovskite over the first electrode pixel in the first region differs from a second filling height of the first layer over the second electrode pixel in the second region, wherein the structure separates the first and the second region.

According to particular embodiments of the detector of the second embodiment, the at least one first perovskite in the first layer comprising at least one first perovskite is at least partially recrystallized.

The following description relates both to the detector of the first embodiment and also to the detector of the second embodiment and described embodiments are possible both for the detector of the first embodiment and also the detector of the second embodiment, provided not stated otherwise or obvious from the context.

The same components or the same materials of the detector of the first and second embodiment can be the same or different in the different detectors.

In the detector of the first embodiment and the detector of the second embodiment, the first electrode layer comprising at least one first electrode pixel and a second electrode pixel as well as an intermediate space between the first electrode pixel and the second electrode pixel is not specifically restricted. More than two electrode pixels can also be arranged in the first electrode layer and the first electrode layer can have a plurality, that is, 2 or more, for example, 3, 4, 5, 6, 7, 8, 9, 10, 100, 1000 or more electrode pixels or pixels, which can be electrically contacted. At least one intermediate space is then provided between the individual electrode pixels, so that in the presence of a plurality of electrode pixels, a plurality of intermediate spaces can also exist. According to particular embodiments, a plurality of X electrode pixels form one pixel effectively as subpixels, wherein X is greater than 1, preferably in the range 2-4. The X electrode pixels can also be designated subpixels and then together form a spectrally sensitive pixel. An illustration of the pixel-subpixel configuration is, for example, the RGB pixel configuration of an LCD television set (each pixel has RGB subpixels provided by color filters).

Neither the pixel size nor the material of the respective electrode pixels is specifically restricted and electrode pixels can be used which have already been used in detectors for electromagnetic radiation, in particular, X-ray and/or gamma detectors. As the electrode pixel, for example, an electrode pixel with a pitch of 98 µm of a square electrode pixel can be used, which defines an electrode pixel, although other pixel sizes are also possible. The material of the electrode pixel is not specifically restricted and can comprise, for example, a conductive metal oxide, a conductive polymer and/or a metal, which serves for the detection of an electron and/or a hole generated by a perovskite. If a substrate is present, a substrate can be a pixelated substrate on which the electrode pixels of the first electrode layer are situated.

According to the number of the electrode pixels in the detector of the first embodiment, the number of the x layers comprising at least one xth perovskite (where x is a natural whole number≥2) is also not specifically restricted and the detector comprises at least as many electrode pixels as there are different layers comprising different perovskites present.

It is hereby not precluded that in a detector of the first embodiment, a plurality of first layers is also present, comprising at least one first perovskite over a plurality of first electrode pixels, a plurality of second layers comprising at least one second perovskite over a plurality of second electrode pixels and possibly further corresponding layers and electrode pixels (thus third, fourth, fifth, sixth, seventh, eighth, ninth, tenth, etc. layers comprising at least a third, fourth, fifth, sixth, seventh, eighth, ninth, tenth, etc. perovskite over third, fourth, fifth, sixth, seventh, eighth, ninth, tenth, etc. electrode pixels).

Similarly, in the detector of the second embodiment, the number of the electrode pixels and the number of the first layers comprising at least one first perovskite with different filling heights is not specifically restricted, and the detector comprises at least as many electrode pixels as there are first layers comprising different filling heights. It is hereby not precluded that in a detector of the second embodiment, a plurality of first layers also occurs, comprising at least one first perovskite over a plurality of first electrode pixels with a first filling height, a plurality of first layers comprising at least one first perovskite over a plurality of second electrode pixels with a second filling height and possibly further corresponding layers and electrode pixels (thus layers comprising at least one first perovskite with different third, fourth, fifth, sixth, seventh, eighth, ninth, tenth, etc. filling heights over corresponding third, fourth, fifth, sixth, seventh, eighth, ninth, tenth, etc. electrode pixels).

The arrangement of the electrode pixels is also not specifically restricted and these can be suitably arranged, for example, according to a respective layer to be applied comprising at least one corresponding perovskite.

If, for example, different layers comprising different perovskites in the detector of the first embodiment are used, an arrangement of the electrode pixels can take place such that, in each case, layers with different perovskites adjoin one another. If, for example, different layers comprising at least four different perovskites are present (thus a first layer comprising at least one first perovskite, a second layer comprising at least one second perovskite, a third layer comprising at least one third perovskite, and a fourth layer comprising at least one fourth perovskite), they can be arranged repetitively linearly behind one another in a "detection row" over respective electrode pixels, or in a type of two-dimensional arrangement, chess board-like in a 2×2 pattern, wherein the respective patterns can then repeat accordingly in detectors with a plurality of electrode pixels and can adjoin one another. For different respective layers comprising at least one corresponding perovskite, similarly, different arrangements can also come about, wherein they are not restricted in their form. Apart from linear and chess board-like arrangements of electrode pixels, triangular, rhombic, polygonal, etc. arrangements are possible wherein the respective layer comprising the at least one corresponding perovskite is arranged over an electrode pixel. It is also not precluded that two layers comprising an identical perovskite in the detector of the first embodiment adjoin one another if the detector has at least one first layer comprising at least one first perovskite and a second layer comprising at least one second perovskite different from the first perovskite over different electrode pixels.

According to the descriptions relating to the arrangement of the electrode pixels in the detector of the first embodiment, an arrangement of the electrode pixels in the detector of the second embodiment can similarly also be carried out, that is, layers can be arranged comprising at least one first perovskite with different filling heights over adjacent and/or non-adjacent electrode pixels, displaced, offset, chess board-like, triangularly, rhombically, etc., wherein here too the number of different filling heights can have an influence on the distribution of the electrode pixels.

In the detector of the first embodiment and in the detector of the second embodiment, at least one intermediate space is situated in the first electrode layer, wherein with a plurality of electrode pixels of more than 2, a plurality of intermediate spaces also lies between electrode pixels, wherein the electrode pixels in the detectors are mutually separated by intermediate spaces. If a large number of electrode pixels and intermediate spaces between the electrode pixels is present, they can form, for example, a grid structure. The intermediate space can or (in the presence of a plurality thereof) the intermediate spaces can comprise, in detectors of the first and second embodiment, a non-conductive material which is not specifically restricted and can also be, for example, a material of a substrate, for example, if electrode pixels are introduced after material removal in a substrate (e.g. by etching, etc.) and introducing the electrode pixels into a substrate, and/or also insulate the electrode pixels of the first electrode layer from one another by other means, for example, with a gas such as air, etc., for example, if the electrode pixels are applied onto a substrate.

In detectors according to an embodiment of the invention, the first electrode layer (and also the second electrode and/or the first layer and/or the second layer, with or without different filling heights, and possibly further layers and/or the substrate, etc.) are flat and/or curved, so that flat or curved detectors can be produced.

Furthermore, in the detectors according to an embodiment of the invention, the second electrode is also not specifically restricted. According to particular embodiments, the second electrode comprises a conductive metal oxide, a conductive polymer and/or a metal. In the detector according to the invention, the first and second electrode (or the first electrode layer and the second electrode) can suitably be connected as anode and/or cathode. According to particular embodiments, the second electrode is configured as planar. According to particular embodiments, the second electrode is at least partially transparent or completely transparent for an electromagnetic radiation to be detected, which is not specifically restricted and can be, for example, X-ray (wavelength≥10 pm and <10 nm) and/or gamma radiation (wavelength<10 pm). For example, the second electrode can comprise indium tin oxide (ITO), aluminum zinc oxide (aluminum doped zinc oxide, AZO), antimony tin oxide (ATO) and/or fluorine tin oxide (FTO) or can consist thereof.

The structure is also not specifically restricted, provided it is arranged at least partially or completely between individual pixels of the first electrode layer. In particular, the structure is also arranged around the individual electrode pixels in order to separate regions over the electrode pixels from one another, that is for example, a first region from a second region and possibly this from further regions, for instance, a third, fourth, fifth, sixth, seventh, eighth, ninth, tenth, etc. region, wherein these regions are also separated from one another. The structure serves in the detectors according to the invention to separate or to insulate the individual electrode pixels and the regions thereabove from one another (and thus represents an auxiliary structure for the separation of different regions and thus has a structuring function), so that the different electrode pixels can detect signals from the different perovskites of the first and second layers in the detector of the first embodiment or layers with different filling heights in the detector of the second embodiment. For this purpose, the structure can also be situated partially on and/or over electrode pixels of the first, pixelated electrode layer, provided it lies partially between the electrode pixels of the first electrode layer, that is, for example, so that it is arranged in the intermediate space or intermediate spaces or in a grid structure of the first electrode layer (formed, for example, from a non-electrode material of the first electrode layer and/or a gas such as air), directly on the intermediate space or intermediate spaces or the grid structure or the material of the intermediate space or the intermediate spaces or the grid structure between electrode pixels, and/or over the intermediate space or intermediate spaces, that is, also on the material of the intermediate space or the intermediate spaces between electrode pixels, for example, the grid structure or its material. For this purpose, the structure is arranged so that it extends away at least from the first electrode layer in the direction of the second electrode, and thus forms a three-dimensional structure which is situated at least between the first electrode layer and the second electrode layer. It is thereby not precluded that parts of the structure are also situated within the first electrode layer, for example, in the intermediate space or the intermediate spaces to provide for a better anchoring of the structure. The structure which is applied, in particular as an electrically insulating structure, can enable an enlargement of the anchor surface for the first layer and the second layer (and possibly further layers comprising at least one corresponding perovskite) in the detector of the first embodiment and also the first layer in the detector of the second embodiment on the first electrode layer and possibly thus also on a substrate.

The structure is therefore situated, according to particular embodiments, at least partially or completely in a region which is defined by way of the intermediate space or the intermediate spaces or the grid structure of the first electrode layer between individual electrode pixels, wherein the structure can also lie in the intermediate space or in the intermediate spaces or the grid structure. It is hereby not precluded that the structure also lies partially on and/or over the electrode pixels of the first electrode layer. The structure is situated between the electrode pixels so that at least over the intermediate space or the intermediate spaces of the first electrode layer in the direction of the second electrode, a 3D shape forms or a three-dimensional body is formed.

In addition to the structuring, the structure enables a manufacturing process where different regions and filling heights or layer thicknesses of layers introduced therein and thus an absorber material of the layers, that is at least one perovskite, can be defined on a pixelwise basis.

According to particular embodiments, the structure surrounds the first region and the second region and possibly third, fourth, fifth, sixth, seventh, eighth, ninth, tenth etc. regions over the respective electrode pixel. If an electrode pixel is arranged at the edge of a detector, the structure at this edge can also be replaced by a housing of the detector, etc., wherein the housing is not specifically restricted and, in particular, is not electrically conductive. According to particular embodiments, however, each region over each electrode pixel is surrounded by the structure. The first layer comprising at least one first perovskite and the second layer comprising at least one second perovskite and possibly further layers comprising corresponding further perovskites, as stated above by way of example, for up to ten layers in the detector of the first embodiment according to particular embodiments, are filled into the structure over the respective electrode pixels such that they are bounded by the respective electrode pixel and the structure and the filling height of the respective layer preferably does not extend beyond the height of the structure. Accordingly, in the detector of the second embodiment, the first layer comprising at least one first perovskite is filled into the structure over the respective first, second and possibly third, fourth, fifth, sixth, seventh, eighth, ninth, tenth, etc. electrode pixels such that they are bounded by the respective electrode pixel and the structure and the filling height of the respective layer preferably does not extend beyond the height of the structure.

Figure 4:
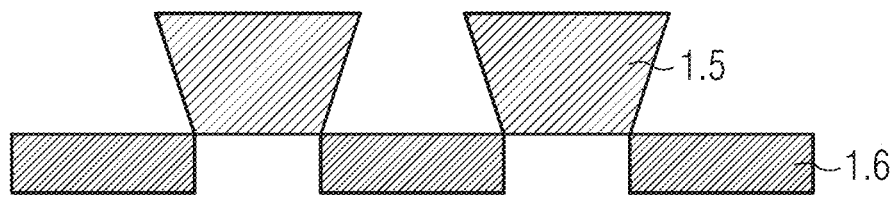
FIGS. 4 to 13 show schematic representations of different example structures that can be used in detectors according to embodiments of the invention.
Figure 5:
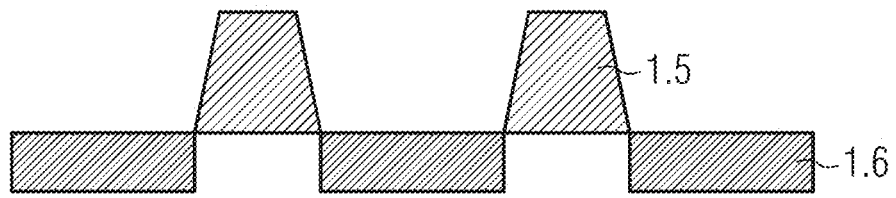
Figure 6:
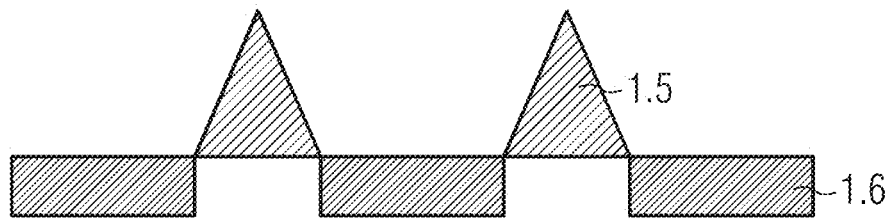
Figure 7:
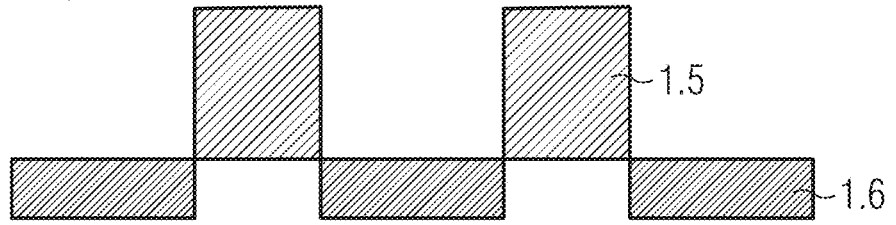
Figure 8:
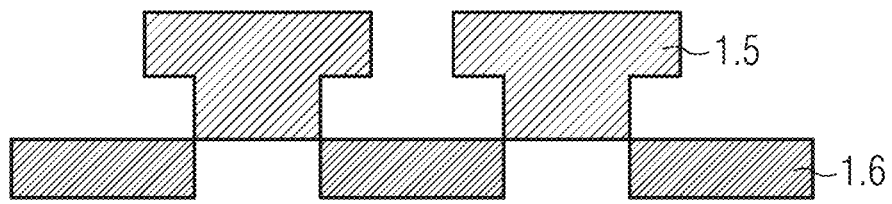

The shape of such a body of the structure is not specifically restricted. Example shapes for the structure are shown schematically in the form of two-dimensional sections in FIGS. 4 to 13. It is also made clear by these drawings how the structure 1.5 is arranged at least partially between the electrode pixels 1.6. In FIGS. 4 and 5, for example, structures are shown which widen or narrow toward the second electrode (not shown, situated thereabove). Such shapes are obtainable, for example, by the use of different photoresists (negative or positive photoresists) during production. The shapes shown in FIGS. 6 to 8 are also obtainable, for example, by using different photoresists and/or other methods described below. The shape shown in FIG. 8 can be produced, for example, by way of a lift-off resist (LOR).

Figure 9:
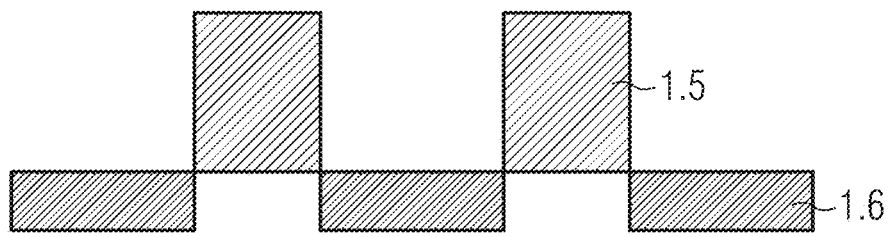
Figure 10:
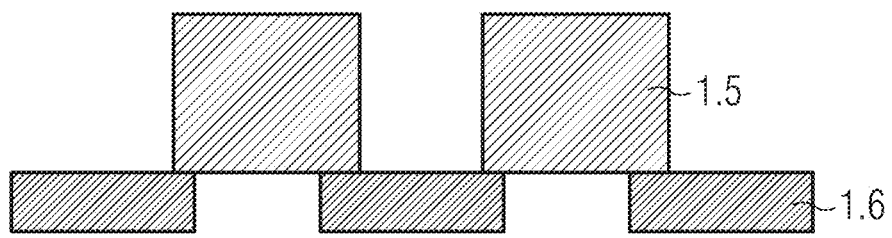
Figure 11:
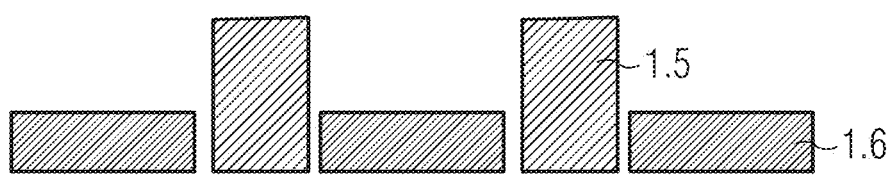
Figure 12:
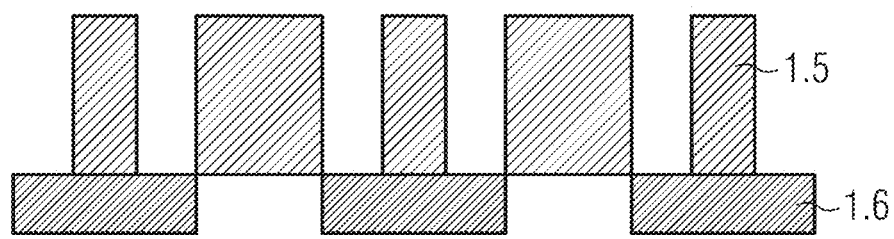
Figure 13:
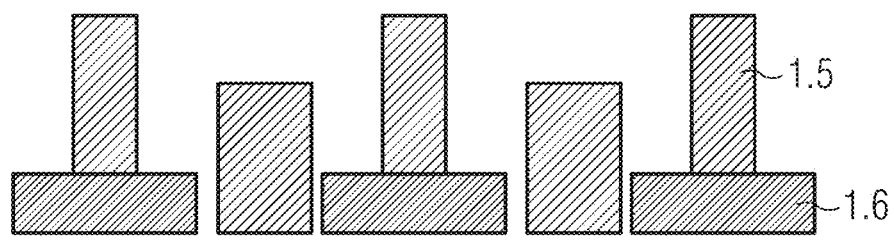

Apart from different shapes, the dimensions of the structure 1.5 can also vary, as shown in FIGS. 9 to 11: An example is that the structures 1.5 fit exactly between the electrode pixels 1.6 (FIG. 9); in another example, the structure 1.5 is broader than the spacing between the electrode pixels 1.6, that is, the intermediate space (FIG. 10); alternatively, the structure 1.5 can also be narrower than the spacing of the electrode pixels 1.6, wherein the structure can then also be introduced here into the intermediate space or the intermediate spaces (which is also not precluded in the other figures; FIG. 11). Furthermore, parts of the structure 1.5 can also be supplemented additionally above the active area of the electrode pixel 1.6, as shown schematically in FIGS. 12 and 13. By this means, the adhesion of the first layer and the second layer in the detector of the first embodiment or of the first layer in the detector of the second embodiment can be further increased, although the detection can also be reduced through the lessening of the active area of the electrode pixels 1.6 available for detection.

In addition, the different shapes of the structure are also obtainable by other means, for example, by selective etching and/or laser ablation of a substrate with subsequent introduction of the electrode pixels in etched and/or ablated regions of the substrate, wherein the material of the intermediate space or intermediate spaces can herein then correspond to the first electrode layer and to the structure of the material of the substrate, and/or by 3D printing. In such cases, as material of the structure, for example, different polymers, ceramics, etc. are possible.

Corresponding methods for selective etching are known, for example, from J. D. Zahn et al., "A direct plasma etch approach to high aspect ratio polymer micromachining with applications in biomems and CMOS-mems", Technical Digest. MEMS 2002 IEEE International Conference. Fifteenth IEEE International Conference on Micro Electro Mechanical Systems, DOI: 10.1109/MEMSYS.2002.984223. An example method for laser erosion is described, for example, by V. N. Tokarev et al. in "High-aspect-ratio microdrilling of polymers with UV laser ablation: experiment with analytical model", Appl. Phys. A, 2002, DOI: 10.1007/s00339-002-1511-8. A method for 3D printing is known, for example, from A. Kain et al., "High aspect ratio- and 3D-printing of freestanding sophisticated structures", Procedia Chemistry 1, 2009, 750-753, DOI: 10.1016/j.proche.2009.07.187, the entire contents of each of which are hereby incorporated herein by reference.

The dimensions of the structure are also not specifically restricted. Preferable, however, is a structure which has a height from the surface of the first pixelated electrode layer of 0.5 to 5000 μm, preferably 0.8 to 4000 μm, more preferably 1 to 3000 μm, yet more preferably 10 to 2000 μm, e.g. 20 to 1800 μm or 30 to 1700 μm, in particular 50 to 1500 μm. For the structure, even in the case of a plurality of electrode pixels, in individual areas of the separation of different micro drilling regions, different heights (and/or possibly also widths) are possible over different electrode pixels, for example, if in a detector of the second embodiment, electrode pixels are arranged at different heights and/or with different thicknesses, in order to enable different filling heights of the first layer comprising at least one first perovskite. A structure with a large aspect ratio (ratio of height to width) is also preferred, in particular, if the structure extends away from the surface of the first, pixelated electrode layer as a "grid" and/or a "wall" (wherein it separates the first and second region), wherein here a width of the wall and/or of the cross-beams of the grid can be, for example, 0.5 to 80 μm, preferably 1 to 50 μm, more preferably 2 to 35 μm, yet more preferably 3 to 25 μm, still more preferably 4 to 15 μm, in particular 5 to 10 μm, wherein the width can be measured, for example, directly on the surface of the first, pixelated electrode layer, in particular with narrowing or broadening structures or otherwise irregularly formed structures. The aspect ratio can herein be dependent upon the application field (e.g. mammography (MAMMO), radiology (RAD), fluoroscopy (FLUORO), non-destructive testing (NDT)), the hardness of the electromagnetic radiation to be detected, the absorption properties of the perovskite, which detects this radiation directly or indirectly (in the presence of a layer comprising at least one scintillator), etc.

It is also not precluded that the electrode pixels are filled into the structure during the production, that is, only after the structure is created. In this regard, larger aspect ratios can possibly also be achieved. If the structure also exists in the intermediate spaces, the electrode pixels are located effectively in the structure, so that the first electrode layer can also be formed here from parts of the structure, in the region of the intermediate space or the intermediate spaces of the first electrode layer (here, the first electrode layer can be understood, for example, as a layer of the same height as the height of the electrode pixels or of the thinnest electrode pixel, which is removed, notionally, from the detector, wherein the material of the structure is then arranged between the electrode pixels and thus fills the intermediate space or the intermediate spaces between the electrode pixels). The intermediate space hereby especially then has or the intermediate spaces have, as otherwise in the first electrode layer, a height which corresponds to the height of the electrode pixels (also designated the pixel electrodes). The electrode pixels can thereby have a filling factor of the structure (that is, in the regions of the structure not filled with the material of the structure, for example in a grid structure as the structure) of, for example, up to 90%, but preferably <50%, more preferably <10% and even more preferably <2%.

For example, a size or a pitch of an electrode pixel of 150 μm or more, a width of the structure of 50 μm and less and/or a height of the structure of up to 1250 μm is possible.

The material of the structure is also not specifically restricted, is however preferably electrically insulating in order to prevent a short-circuit between individual electrode pixels. The material of the structure can herein also be dependent upon the production of the structure itself. As described above, the material of the structure can also correspond to the material of the intermediate space or the intermediate spaces and possibly also a substrate, but can also be different, for example, where a material is applied, as in 3D printing or the application of resists.

Thus, an example production of the structure by the application of resists, for example, photoresists is possible, which can be suitably structured with molds and/or masks and possibly also applied multiple times. The resists, for example photoresist, are not specifically restricted. By way of a suitable selection of the resists, for example, photoresists, an adhesion of the first layer and the second layer and, in particular, the at least one first perovskite and the at least one second perovskite in the detector of the first embodiment or the first layer and, in particular, a first perovskite in the detector of the second embodiment, to the structure can also be influenced. This also includes a wetting behavior of the material of the first layer and the second layer or of the first layer and, in particular, the at least one first perovskite and at least one second perovskite or of the at least one first perovskite if it or they is/are at least partially liquefied in a method according to the invention for recrystallization. A similar principle applies also for other materials in other production methods, as mentioned above.

The different photoresists are not specifically restricted and can be, for example, both positive as well as negative or other structurable materials. Examples of positive photoresists are e.g. AZ 10XT, AZ 12XT, AZ 40XT, AZ 4533, AZ 4562, AZ 9245, AZ 9260, AS IPS 6050, AZ P4110, AZ P4260, AZ P4903 and PL 177 from Microchemicals GmbH, and examples of negative photoresists are e.g. AZ 125nXT, AZ 125 nXT (115CPS), AZ 15nXT (450CPS), AZ nLof 2020, AZ nLof 2035, AZ nLof 2070 and AZ nLof 5510 from Microchemicals GmbH. Further examples of photoresists and methods for their structuring are given by B. Loechel in "Thick-layer resists for surface micromachining", J. Micromech. Microeng. 10, 2000, 108-115, the entire contents of which are hereby incorporated herein by reference. A further example of a photoresist is SU-8, given for example by A. del Campo and C. Greiner in "SU-8: a photoresist for high-aspect-ratio and 3D submicron lithography", J. Microchem. Microeng. 17, 2007, R81-R95, the entire contents of which are hereby incorporated herein by reference.

The first layer comprising at least one first perovskite and the second layer comprising at least one second perovskite, which is different from the first perovskite, in the detector of the first embodiment are also not specifically restricted or the first layer comprising at least one first perovskite in the detector of the second embodiment is also not specifically restricted. The quantity of first perovskite in the first layer and the quantity of second perovskite in the second layer or of further perovskites in the detector of the first embodiment in further layers that are different from other perovskites is also not specifically restricted.

According to particular embodiments, the first layer comprises the at least one first perovskite in a quantity of 30% w/w, 50% w/w, or 70% w/w, relative to the first layer, or substantially consists of the first perovskite (e.g. 90% w/w, 95% w/w, or 99% w/w, relative to the first layer); or even consists of the at least one first perovskite, the second layer comprises the at least one second perovskite in a quantity of 30% w/w, 50% w/w, or 70% w/w, relative to the first layer, or substantially consists of the second perovskite (e.g. 90% w/w, 95% w/w, or 99% w/w, relative to the second layer); or even consists of the at least one second perovskite, etc.

The filling height of the first and the second layer and any further layers comprising at least one corresponding perovskite in the detector of the first embodiment is not specifically restricted and can, for example, correspond to the height of the structure, that is for example, can have a height of 0.5 to 5000 µm, preferably 0.8 to 4000 µm, more preferably 1 to 3000 µm, yet more preferably 10 to 2000 µm, e.g. 20 to 1800 µm or 30 to 1700 µm, in particular 50 to 1500 µm, but can also be smaller or larger, but in the detector of the first embodiment is preferably the same or smaller, in order to prevent contacting of the layers comprising different perovskites. In the detector of the second embodiment, the filling heights of the first layer comprising the at least one first perovskite in different regions, that is, in the first, second and any further regions, wherein the filling height in a (e.g. first) region can correspond, for example, to the height of the structure, thus can have a height of 0.5 to 5000 µm, preferably 0.8 to 4000 µm, more preferably 1 to 3000 µm, yet more preferably 10 to 2000 µm, e.g. 20 to 1800 µm or 30 to 1700 µm, in particular, 50 to 1500 µm, or can be smaller or larger and, in further regions (e.g. a second, third, fourth, etc. region) less than this height, for example by 10, 20, 30, 40, 50, 60, 70, 80, 90% or more.

In the first layer, the at least one first perovskite is not specifically restricted and it can comprise a perovskite or a plurality of perovskites, for example, 2, 3, 4, 5 or more perovskites. According to particular embodiments, the first layer comprises a perovskite. In the detector of the second embodiment, in the second layer, the at least one second perovskite is not specifically restricted and it can comprise a perovskite or a plurality of perovskites, for example, 2, 3, 4, 5 or more perovskites, wherein at least one differs from a perovskite of the first layer. According to particular embodiments, the second layer comprises a perovskite. A similar principle applies also if, in addition thereto, a plurality of layers comprising further perovskites are provided.

The first perovskite, the second perovskite, etc. are not specifically restricted. For example, both organic-inorganic and also purely inorganic perovskites with an ABX3 structure, having one or more cations (A+), one or more B+cations and one or more halides X- can be used, which are not specifically restricted. Examples of suitable perovskites as the first perovskite, second perovskite, etc. in the detector of the first embodiment or as the first perovskite in the detector of the second embodiment are, according to particular embodiments, MAPbI3 (CH3NH3PbI3), MAPbBr3 (CH3NH3PbBr3), FAPbI3 (HC(NH2)2PbI3), MAPbICl2 (CH3NH3PbICl2), FAPbBr3 (HC(NH2)2PbBr3), EAPbI3 (CH3CH2NH3PbI3), PAPbI3 (CH3CH2CH2NH3PbI3), BA2PbI4 ((CH3CH2CH2CH2NH3)2PbI4), PMA2PbI4 ((C6H5CH2NH3)2PbI4), PEA2PbI4 ((C6H5CH2CH2NH3)2PbI4), EAPbBr3 (CH3CH2NH3PbBr3), PAPbBr3 (CH3CH2CH2NH3PbBr3); mixed halides thereof; inorganic-organic perovskites with a mixture of A-cations with halides X (X=Cl, I, and/or Br), for example MAFAPbX3 (MA=CH3NH3, FA=HC(NH2)2), MAGAPbX3 (GA=guanidinium), BAPAPbX3 (BA=CH3CH2CH2CH2NH3, PA=CH3CH2NH3); organic halogenated mixtures in which the halogens are partially substituted by other halogens (e.g. with halides of the formula I3-xClx or Br3-xClx, etc., e.g. MAPbI3-xClx or CH3NH3PbBr3-xClx); organic and/or organic-inorganic perovskites in which Pb is substituted at least partially or even completely by Sn, Cu, Ni, Bi, Co, Fe, Mn, Cr, Cd, Ge and/or Yb, and/or mixtures thereof; inorganic perovskites and mixtures thereof, for example CsPbX3, where X=Cl, Br, and/or I, and mixtures thereof, Cs3Bi2X9, where X=Cl, Br, and/or I, and mixtures thereof, Cs3Sb2X, where X=Cl, Br, and/or I, and mixtures thereof, Cs2AgBiX6, where X=Cl, Br, and/or I, and mixtures thereof, Rb3Bi2X9, where X=Cl, Br, and/or I, and mixtures thereof, Rb3Sb2X9, where X=Cl, Br, and/or I, and mixtures thereof, CsSnI3; etc., and mixtures of the perovskites.

By way of the first layer (detector of the first and second embodiment), the second layer and possibly further layers (detector of the first embodiment), in conjunction with the structure, a better adhesion of further layers to the first electrode layer can also be achieved.

The introduction of the first layer and the second layer and any further layers into the structure in the detector of the first embodiment or the first layer in the detector of the second embodiment is not specifically restricted, and they or it can be introduced such that they or it only partially fill(s) the structure, they or it can be introduced such that they or it exactly fill(s) the structure, thus finishing with an upper edge or an uppermost point of the structure, or they or it can be introduced such that they or it extend(s) beyond the structure, thus fill(s) it and also cover(s) it partially or fully, wherein the latter is not preferred, in particular, for the detector of the first embodiment. The shape of the introduction, that is, the filling in the case of incomplete filling, can also be dependent upon the material of the structure, as described above.

Figure 19:
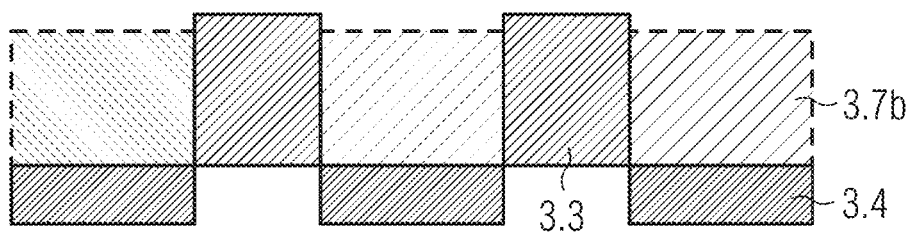
FIGS. 19 to 22 show schematic representations of example first layers in detectors according to embodiments of the invention.
Figure 20:
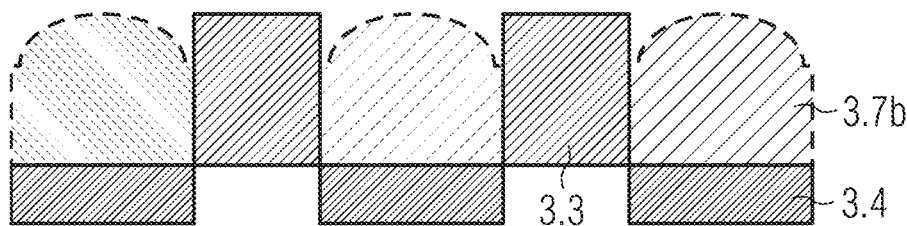
Figure 21:
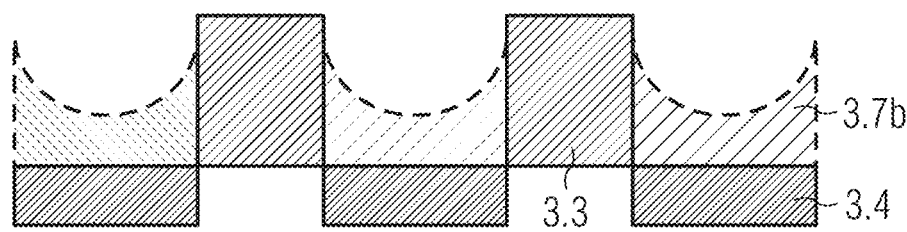
Figure 22:
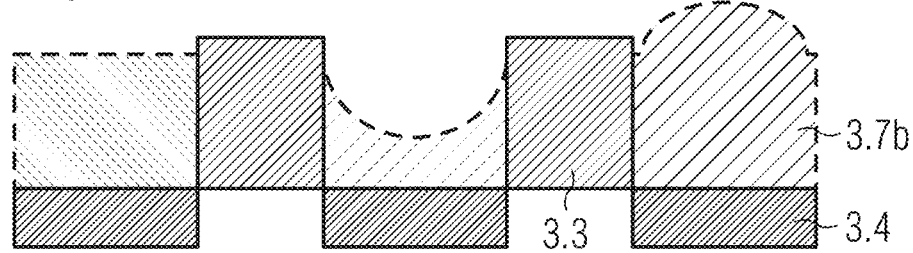

Various examples for such different fillings are shown in FIGS. 19 to 22. What are shown here are electrode pixels 3.4 with the structure 3.3 and the first layer 3.7b (and further, different layers which are not shown here and correspond to the detector of the first embodiment), which comprise, for example, a recrystallized first perovskite, as described below. A variant is that the first layer 3.7b is filled into the structure 3.3 with a flat upper edge (straight plane beneath the height of the structure), as FIG. 19 shows. In addition, the layers, including the first layer 3.7b, can have a positive curvature (FIG. 20) or a negative curvature, as shown in FIG. 21, or mixtures of flat upper edges, positive curvatures and/or negative curvatures, as shown in FIG. 22. This depends, for example, upon the wetting behavior (hydrophobic, hydrophilic) of the structure and/or of the first electrode layer, for example the electrode pixels. Other shapes are also conceivable.

According to particular embodiments, the at least one first perovskite in the first layer comprising at least one first perovskite is at least partially recrystallized and, in particular, is recrystallized. By this means, the first layer can be better connected to the structure. In the detector of the first embodiment, the at least one second perovskite in the second layer comprising at least one second perovskite—and possibly further perovskites in further layers—is also at least partially recrystallized and, in particular, is recrystallized. By this, the second layer and possibly further layers can be better connected to the structure.

The recrystallization is thereby not specifically restricted. In particular, the recrystallized first perovskite differs from a non-recrystallized first perovskite, the recrystallized second perovskite differs from a non-recrystallized second perovskite, etc., since the crystal structure changes on recrystallization. Accordingly, a corresponding first, second and possible further layer with at least partially or completely recrystallized perovskite (herein also called the recrystallized layer) can easily be distinguished from another layer with the same perovskite in which this perovskite is not recrystallized, since the layers have a different morphology which is easily detectable with X-ray electron microscopy (REM) or transmission electron microscopy (TEM) on the basis of images. X-ray diffraction (XRD) spectra of the layers also have differences.

A recrystallization can take place in a variety of ways, for example, by melting while using methylamine gas, in particular, in the case of perovskites which contain methylammonium ions, by pressure and/or temperature, wherein the methods can be adapted to the perovskite being used. For example, the first, second, etc., perovskite comprises alkylammonium ions, in particular with 1-4 C atoms, more preferably methylammonium ions and treatment to produce the first, second, possibly further layer, takes place with a gas comprising methylamine, in particular with methylamine gas.

The treatment of perovskites containing methylammonium ions by way of methylamine (MA) gas was described in 2017 by Li et al. (Li, C., S. Pang, H. Xu and G. Cui. Methylamine gas based synthesis and healing process toward upscaling of perovskite solar cells: Progress and perspective. Solar RRL, 1(9), 1700076 (2017).). In their paper, they describe the liquefaction of the previously solid perovskite layer after the action of MA gas and the subsequent recrystallization with a changed morphology, as soon as the MA gas is no longer contained in the atmosphere. The patent EP 3304611 B1 uses this phenomenon in order to produce a perovskite from precursors (inter alia, a metal halide) applied onto two different surfaces. CN 10209088003 A describes a process in which a monocrystalline perovskite powder is applied onto a mesoporous layer, for example, titanium oxide and liquefied by way of MA gas. As a liquid metaphase, the perovskite penetrates into the pores and recrystallizes there.

In particular, treatment with MA gas is preferred, since it is technically easily achievable and only small quantities of MA gas (e.g. in a chamber with negative pressure and a pressure of the MA gas of from 10-6 mbar to 10 bar, e.g. in a chamber with a volume of 1 l (for example, 0.25 g MA gas at 200 mbar pressure)) are required, which saves costs.

The first, second and possible further layer can also be applied as single layers multiple times and recrystallized. The first, second and possible further layer comprising at least one first, second and possible further liquefied and recrystallized perovskite can serve here, in particular, as an adhesion promoter between the first electrode layer or an optional other layer applied thereon, such as an electron conductor or hole conductor layer and a possible further layer comprising at least one scintillator.

Figure 23:
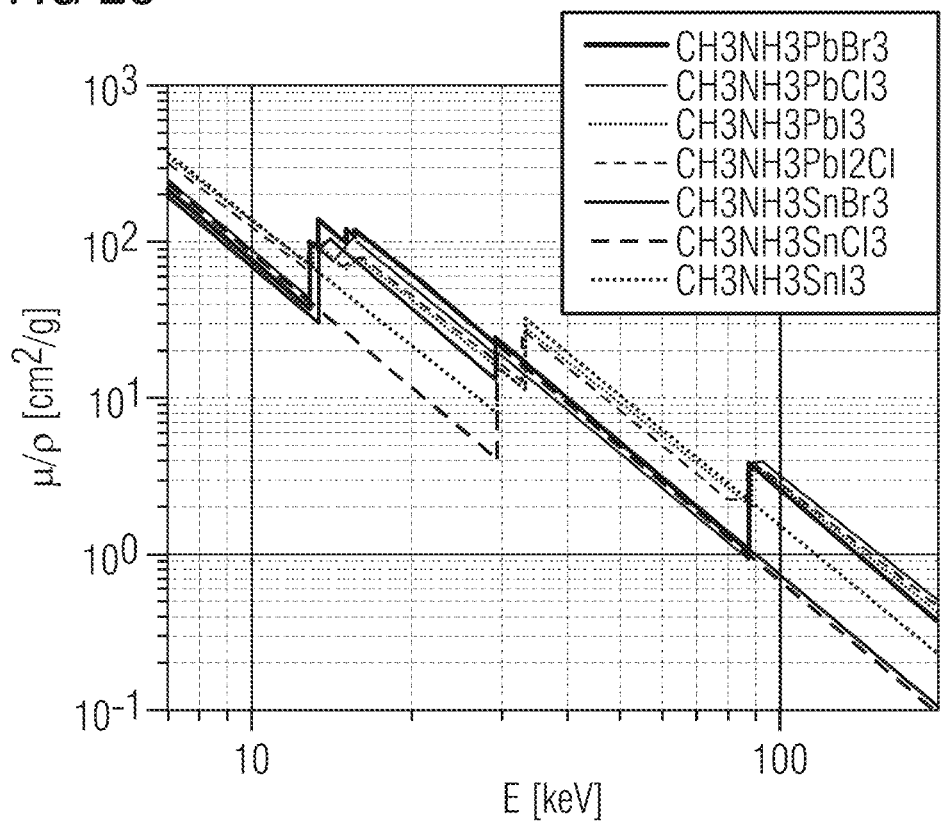
FIGS. 23 and 24 show comparisons of spectral properties of different perovskites.
Figure 24:
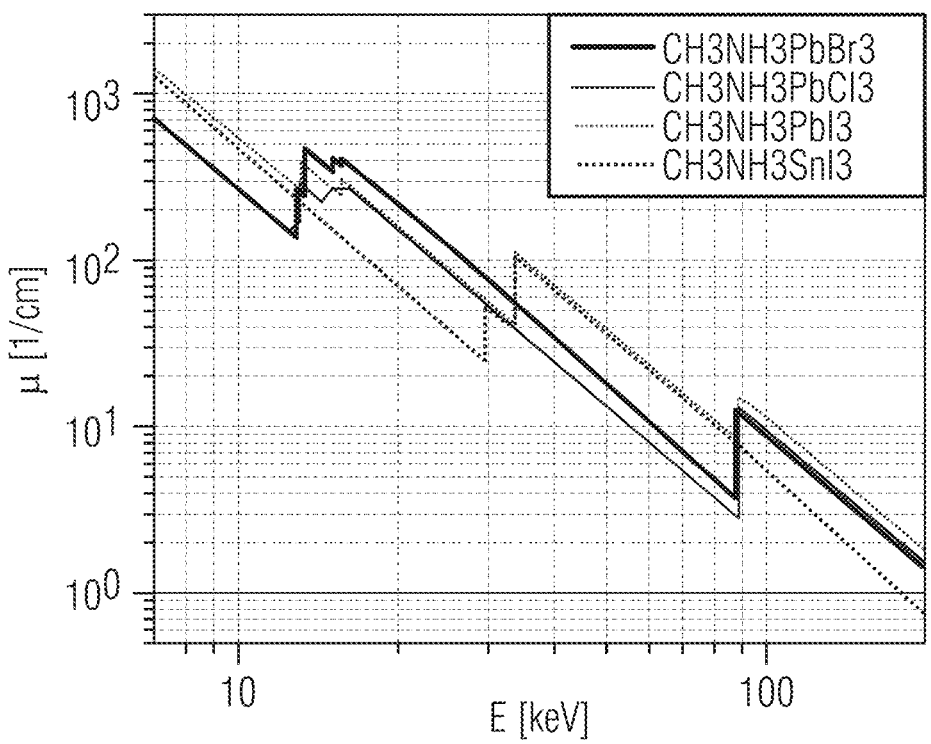

In the detector of the first embodiment, at least one first perovskite and at least one second perovskite and possibly further perovskites are used. The combination of such perovskites which are filled into the different separate regions with the respective layers can be dependent upon their absorption coefficients dependent upon the wavelength or energy of the incident electromagnetic radiation. FIG. 23 shows examples of different mass attenuation coefficients µ/ρ of different perovskites with MA+ dependent upon the photon energy E of the X-ray radiation. FIG. 24 additionally shows different mass absorption coefficients µ of different perovskites with MA+ dependent upon the photon energy E of the X-ray radiation. In both spectra, the absorption edges are clearly apparent. From both spectra, it is clear that herein by way of different perovskites, different radiation can be detected differently, so that a spectral resolution of a material to be investigated is possible.

In the detector of the second embodiment, the spectral resolution can be achieved by way of the different filling heights. Electrode pixels (meaning also subpixels) with the lowest filling height enable only the complete detection of low-energy electromagnetic radiation. With increasing filling height, the absorbed proportion of the high-energy photons increases. The correlation of the signals of the electrode pixels makes an item of spectral information possible.

According to particular embodiments, a detector of the first embodiment or a detector of the second embodiment further comprise a layer comprising at least one scintillator, which is situated at least between the structure and the second electrode. By this means, an indirect detection of radiation in the layers comprising perovskite is possible, as described above. If a plurality of layers comprising different scintillators are applied, a broader spectral resolution is also possible here.

The layer comprising at least one scintillator is herein not specifically restricted. According to particular embodiments, it has a thickness (in the direction between the first, pixelated electrode layer and the second electrode) of 5 to 5000 μm, preferably 10 to 3000 μm, more preferably 50 to 2000 μm, yet more preferably 100 to 1500 μm. The third layer can be produced as a separate layer, for example, as a separately produced scintillator layer and can be either free-standing or not free-standing, that is for example, therefore during production also in contact with the second electrode or an optional electron-conducting or hole-conducting layer, e.g. in contact with an ITO or FTO electrode, wherein the second electrode can also be on a transparent surface layer, such as a glass.

According to particular embodiments, the layer comprising at least one scintillator is in contact with the first layer and the second layer and possibly further layers (detector of the first embodiment) or the first layer (detector of the second embodiment) and/or the structure.

In embodiments with a layer comprising at least one scintillator, it serves, in particular, as a detection layer for high-energy radiation, for example, X-ray and/or gamma radiation, and the layer or layers comprising at least one perovskite serves or serve for indirect detection by the conversion of photons which are generated in the layer comprising at least one scintillator.

The scintillator of the layer comprising at least one scintillator is not specifically restricted. For example CsI:Tl, caesium iodide doped with thallium, gadolinium oxysulfide doped with terbium, barium fluoride (BaF2), bismuth germanate (BGO), beryllium fluoride (BeF3), quantum dots, scintillating perovskite nanocrystals, etc., are suitable as a scintillator.

According to particular embodiments, a detector of the first embodiment or a detector of the second embodiment further comprises an electron-conducting layer and/or a hole-conducting layer, which is situated between the first electrode layer and the second electrode. A plurality of electron-conducting and/or hole-conducting layers can also be included in the detector.

The electron-conducting and/or hole-conducting layer is herein not specifically restricted, and just one electron-conducting layer, just one hole-conducting layer or an electron-conducting layer and a hole-conducting layer can be present in the detector according to the invention. An electron-conducting and/or hole-conducting layer herein represents an intermediate layer which is also designated an interlayer. An interlayer is accordingly an intermediate layer which functions either as an electron-transporting (or hole-blocking (HBL)) layer, that is as an electron-conducting layer or as a hole-transporting (or electron-blocking (EBL)) layer, that is, a hole-conducting layer.

The materials for such electron-conducting and/or hole-conducting layers are not specifically restricted, and layers can be utilized which are used in common electron-conducting and/or hole-conducting layers.

An example electron-conducting layer (HBL) can comprise, for example, the following materials, e.g. with 30% w/w, ≥50 wt. %, or ≥70% w/w, relative to the electron-conducting layer; can substantially consist thereof (e.g. ≥90% w/w, ≥95% w/w, or ≥99% w/w, relative to the electron-conducting layer); or can even consist thereof (wherein the following list is not exhaustive and also comprises mixtures and isomeric mixtures of the materials mentioned, for example, also binary, tertiary, quaternary mixtures, etc.): fullerene derivatives such as C60 PCBM ([6,6]-phenyl C61 butanoic acid methyl ester), C70 PCBM ([6,6]-phenyl C71 butanoic acid methyl ester), bis-C60 PCBM (bis-[6,6]-phenyl C61 butanoic acid methyl ester), C60 oQDM (o-quinodimethane C60 monoadduct), bis-C60 oQDM (o-quinodimethane C60 bisadduct), ICMA (indene C60 monoadduct, ICBA (indene C60 bisadduct), fullerol (C60(OH)44); further acceptors, comprising polymers and small molecules, such as: dithienoindacene-based compounds such as 3,9-bis(2-methylene-(3-(1,1-dicyanomethylene)-indanone))-5,5,11,11-tetrakis(4-hexylphenyl)-dithieno [2,3-d:2',3'-d']-s-indaceno[1,2-b:5,6-b']dithiophene) (ITIC), IT-M (ITIC-M; 3,9-bis(2-methylene-((3-(1,1-dicyanomethylene)-6/7-methyl)-indanone))-5,5,11,11-tetrakis(4-hexylphenyl)-dithieno[2,3-d:2',3'-d']-s-indaceno[1,2-b:5,6-b'] dithiophene), IT-DM (ITIC-DM; 3,9-bis(2-methylene-((3-(1,1-dicyanomethylene)-6,7-dimethyl)-indanone))-5,5,11, 11-tetrakis(4-hexylphenyl)-dithieno[2,3-d:2',3'-d']-s-indaceno[1,2-b:5,6-b']dithiophene) and IDTBR ((5Z,5'Z)-5, 5'-((7,7'-(4,4,9,9-tetraoctyl-4,9-dihydro-s-indaceno[1,2-b:5, 6-b']dithiophene-2,7-diyl)bis(benzo[c][1,2,5]thiadiazole-7, 4-diyl))bis(methanylylidene))bis(3-ethylthiazolidin-2,4-dione)); perylenediimide-based compounds such as TPB (tert-butylprydine, C9H13N), SdiPDI-Se (perylenediimide-derivative modified by insertion of selenophene-units into the bay position), NIDCS-HO ((2E,2'E)-3,3'-(2,5-bis(hexyloxy)-1,4-phenylene)bis(2-(5-(4-(N-(2-ethylhexyl)-1,8-naphthalimid)yl)-thiophene-2-yl)acrylonitrile)); diketopyrrolopyrrole-based compounds such as DPP6 (dipeptidylaminopeptidase-like protein 6), 6,6'-(benzo[c][1, 2,5]thiadiazole-4,7-diylbis([2,2'-bithiophene]-5',5-diyl))bis (2,5-bis(2-ethylhexyl)-3-(thiophene-2-yl)-2,5-dihydropyrrolo[3,4-c]pyrrole-1,4-dione) (DTDfBT (DPP) 2), 6,6',6'', 6'''-(9,9'-spirobi[fluorene]-2,2',7,7'-tetrayltetrakis (thiophene-5,2-diyl))tetrakis(2,5-bis(2-ethylhexyl)-3-(5-phenylthiophene-2-yl)-2,5-dihydropyrrolo[3,4-c]pyrrole-1, 4-dione) (SF(DPPB)4); PFN (poly[(9,9-bis(3'-(N,N-dimethylamino)-propyl)-2,7-fluorene)-alt-2,7-(9,9-dioctylfluorene)]), PFN-OX (poly[9,9-bis(60-(N,N-diethylamino)propyl)-fluorene-alt-9,9-bis-(3-ethyl(oxetane-3-ethyloxy)-hexyl)-fluorene]), PFO (poly(9,9-di-n-octylfluorenyl-2,7-diyl)), PPDIDTT (poly{[N,N'-bis(2-decyl-tetradecyl)-3,4,9,10-perylenediimid-1,7-diyl]-alt-(dithieno[3,2-b:2',3'-d]thiophene-2,6-diyl)}), TPBi (1,3,5-tris(N-phenylbenzimidazole-2-yl)benzene); metal oxides such as TiOx, SnOx, etc.

An example hole-conducting layer (EBL) can comprise, for example, the following materials, e.g. with ≥30% w/w, ≥50 wt. %, or ≥70% w/w, relative to the electron-conducting layer; can substantially consist thereof (e.g. ≥90% w/w, ≥95% w/w, or ≥99% w/w, relative to the electron-conducting layer); or can even consist thereof (wherein the following list is not exhaustive and also comprises mixtures of the materials mentioned, for example, also binary, tertiary, quaternary mixtures, etc.):poly(3-hexylthiophene-2,5-diyl) (P3HT), poly[2-methoxy-5-(2-ethylhexyloxy)-1,4-phenylenevinylene] (MEH-PPV), poly[2-methoxy-5-(3',7'-dimethyloctyloxy)-1,4-phenylenevinylene] (MDMO-PPV), CN-PPV, CN-MEH-PPV, other phthalocyanines, poly[(9,9-di-n-octylfluorenyl-2,7-diyl)-alt-(benzo[2,1,3]thiadiazole-4,8-diyl)] (F8BT), polyfluorene (PF), poly[2,1,3-benzothiadiazole-4,7-diyl[4,4-bis(2-ethylhexyl)-4H-cyclopenta[2,1-b:3,4-b']dithiophene-2,6-diyl]] (PCPDTBT), squaraine (e.g. symmetrical squaraine with e.g. terminal hydrazone with glycolic functionalization or diazulene-squaraine), PTT) (polythieno[3,4-b]thiophene), poly(5,7-bis(4-decanyl-2-thienyl)-thieno(3,4-b)diathiazole-thiophene-2,5) (PDDTT); diketopyrrolopyrrol-based polymers such as poly{2,2'-[(2,5-bis(2-hexyldecyl)-3,6-dioxo-2,3,5,6-tetrahydropyrrolo[3,4-c]pyrrol-1,4-diyl)dithiophene]-5,5'-diyl-alt-thiophene-2,5-diyl}(PDPP3T), poly[[2,5-bis(2-hexyldecyl-2,3,5,6-tetrahydro-3,6-dioxopyrrolo[3,4 c]pyrrol-1,4-diyl]-alt-[3',3"-dimethyl-2,2':5',2"-terthiophene]-5,5"-diyl] (PMDPP3T), poly{2,2'-[(2,5-bis(2-hexyldecyl)-3,6-dioxo-2,3,5,6-tetrahydropyrrolo[3,4-c]pyrrol-1,4-diyl)dithiophene]-5,5'-diyl-alt-terthiophene-2,5-diyl}(PDPPST), poly[2,6-4,8-di(5-ethylhexylthienyl)benzo[1,2-b;3,4-b]dithiophene-alt-5-dibutyloctyl-3,6-bis(5-bromthiophene-2-yl)pyrrolo[3,4-c]pyrrol-1,4-dione} (PBDTT-DPP); dithienosilol-based polymers such as poly[(4,4-bis(2-ethylhexyl)dithieno[3,2-b:2',3'-d]silol)-2,6-diyl-alt-(4,7-bis(2-thienyl)-2,1,3-benzothiadiazole)-5,5'-diyl] (PSBTBT), 7,7'-(4,4-bis(2-ethylhexyl)-4H-silol[3,2-b:4,5-b']dithiophene-2,6-diyl)bis(6-fluoro-4-(5'-hexyl-[2,2'-bithiophene]-5-yl)benzo[c][1,2,5]thiadiazole) (p-DTS(FBTTh)2)2), poly[2,7-(9,9-dioctyl-dibenzosilole)-alt-4,7-bis(thiophene-2-yl)benzo-2,1,3-thiadiazole] (PSiFDTBT); benzodithiophene-based polymers such as poly[4,8-bis[(2-ethylhexyl)oxy]benzo[1,2-b:4,5-b']dithiophene-2,6-diyl-alt-3-fluoro-2-[(2-ethylhexyl)carbonyl]thieno[3,4-b]thiophene-4,6-diyl] (PTB7), poly[(2,6-(4,8-bis(5-(2-ethylhexyl)thiophene-2-yl)-benzo[1,2-b:4,5-b']dithiophene))-alt-(5,5-(1',3'-di-2-thienyl-5',7'-bis(2-ethylhexyl)benzo[1',2'-c:4',5'-c']dithiophene-4,8-dione))]) (PBDB-T), poly{2,6'-4,8-di(5-ethylhexylthienyl)benzo[1,2-b;3,4-b]dithiophene-alt-5-dibutyloctyl-3,6-bis(5-bromothiophene-2-yl)pyrrolo[3,4-c]pyrrol-1,4-dione (PBDTT-DPP), poly[4,8-bis(5-(2-ethylhexyl)thiophene-2-yl)benzo[1,2-b;4,5-b']dithiophene-2,6-diyl-alt-(4-(2-ethylhexyl)-3-fluorothieno[3,4-b]thiophene-)-2-carboxylate-2-6-diyl)] (PBDTT-FTTE), poly[(4,8-bis-(2-ethylhexyloxy)-benzo(1,2-b:4,5-b')dithiophene)-2,6-diyl-alt-(4-(2-ethylhexanoyl)-thieno[3,4-b]thiophene-)-2-6-diyl)] (PBDTTT-C-F), polybenzothiadiazole (thiophene)-stat-benzodithiophene (thiophene)-8(PBTZT-stat-BDTT-8) and other polymers and copolymers and small molecules with absorption maxima in the range 320-800 nm; polytriarylamine and derivates, poly[[2,5-bis(2-octyldodecyl)-2,3,5,6-tetrahydro-3,6-dioxopyrrolo[3,4-c]pyrrol-1,4-diyl]-alt2[[2,2'-(2,5-thiophene)bisthieno[3,2-b]thiophene]-5,5'-diyl]] (DPP (P)), polyaniline (PANI), poly[(4,8-bis-(2-ethylhexyloxy)-benzo(1,2-b:4,5-b')dithiophene)-2,6-diyl-alt-(4-(2-ethylhexanoyl)-thieno[3,4-b]thiophene)-2-6-diyl)] (PBDTTT-C), poly[N29-hepta-decanyl-2,7-carbazole-alt-3,6-bis-(thiophene-5-yl)-2,5-dioctyl-2,5-dihydropyrrolo[3,4-]pyrrol-1,4-dione] (PCBTDPP), poly[[9-(1-octylnonyl)-9H-carbazole-2,7-diyl]-2,5-thiophenediyl-2,1,3-benzothiadiazole-4,7-diyl-2,5-thiophenediyl] (PCDTBT), poly[2,5-bis(2-octyldodecyl)pyrrolo[3,4-c]pyrrol-1,4(2H, 5H)-dione-(E)-1,2-di(2,2'-bithiophene-5-yl)ethene] (PDPPDBTE), perfluoro(4-methyl-3,6-dioxaoct-7-ene) sulfonylfluoride (PFI), poly(4-styrolsulfonate)-graft-polyaniline (PSS-g-PANI), copolymers of 2'-butyloctyl-4,6-dibromo-3-fluorothieno[3,4-b]thiophene-2-carboxylate (TT-BO), copolymers of 3',4'-dichlorobenzyl-4,6-dibromo-3-fluorothieno-[3,4-b]thiophene-2-carboxylate (TT-DCB) and 2,6-bis(trimethyl-tin)-4,8-bis(2-ethylhexyloxy)benzo[1,2-b:4,5-b']dithiophene (BDT-EH) (PTB-DCB21); N2,N2,N2',N2',N7,N7,N7',N7'-octakis(4-methoxyphenyl)-9,9'-spirobi[9H-fluorene]-2,2',7,7'-tetramine (spiro-OMeTAD), poly[(9,9-dioctylfluorenyl-2,7-diyl)-co-(4,4'-(N-(4-sec-butylphenyl)diphenylamine)] (TFB), N4,N4'-di(naphthalene-1-yl)-N4,N4'-bis(4-vinylphenyl)biphenyl-4,4'-diamine (VNPB), 1,4-bis(4-sulfonatobutoxy)benzene and a thiophene content (PhNa-1T)); metal oxides such as $NiO_x$, $MoO_x$, etc.

An electron-conducting and/or a hole-conducting layer can be provided, for example, between the first electrode layer and the first layer and the second and possible further layers, between the first layer and the second and possible further layers and the layer comprising at least one scintillator, between an optional layer comprising at least one scintillator and the second electrode and/or between the first layer and the second and possible further layers and the second electrode, etc.

According to particular embodiments, a detector of the first embodiment or a detector of the second embodiment further comprise a substrate on which the first electrode layer is situated, wherein the substrate preferably has a first and a second transistor, wherein further preferably, the first transistor contacts at least the first electrode pixel and the second transistor contacts at least the second electrode pixel of the first electrode layer.

The substrate is not specifically restricted and can be, for example, a pixelated substrate. In particular, the substrate serves for contacting the electrode pixels and/or for stabilizing the detector, but also simplifies its production. The substrate can be such as commonly occurs in detectors, in particular, X-ray and/or gamma detectors.

The transistors are also not specifically restricted and can be, for example, TFT. A plurality of transistors can also contact one electrode pixel.

According to particular embodiments, a surface layer, for example, a glass and/or an encapsulation can also be provided on the second electrode.

In addition, the installation of filters, for example onto the individual electrode pixels, if the electromagnetic radiation comes from beneath the electrode pixels, or between the layer or layers and the second electrode and/or on the second electrode opposite the layer or layers is conceivable. According to particular embodiments, the second electrode can also assume a filter function, for example, in that it has a different thickness over different electrode pixels. Conductive filters, for example, metals such as Al, Au, Ag, Sn, Cr, Ti, Pt, Pb, Bi, Cu, Mo, Ta, Ga, and/or alloys thereof, and/or non-conductive compounds such as ceramics, e.g. as a powder, are suitable as filters: Al2O3, boron nitride, ZrO2, AlN, etc. The hardening of the spectrum for a particular pixel facilitates the spectral separation. The filters are thereby not specifically restricted.

A detector according to an embodiment of the invention is configured, in particular, planar. Herein, planar means, according to particular embodiments, a contacting of the area of the first layer, per electrode pixel, that is greater than 60% of the area of the electrode pixel, preferably >80%, more preferably >90%, e.g. more than 95%, more than 99% or even 100%.

An example detector of the first embodiment according to the invention is shown schematically in FIG. 1, wherein an example layer arrangement is shown therein, here for example, an X-ray and/or gamma detector (according to the "active parts" of the detector). An example arrangement for 4 different perovskites in different layers is shown in FIG. 1.

The substrate 1.8 comprises transistors 1.7, for example, thin film transistors (TFTs) in an active matrix driving scheme. The transistors 1.7 contact the electrode pixels 1.6 which form a structured first electrode layer. Arranged between the electrode pixels 1.6 are intermediate spaces, over which a structure 1.5 is arranged, in this case, for example, as a grid or walls. Arranged in the structure 1.5 is a first layer 1.1, comprising at least one first perovskite which is recrystallized, a second layer 1.2 comprising at least one second perovskite which is recrystallized, a third layer 1.3 comprising at least one third perovskite which is recrystallized and a fourth layer 1.4 comprising at least one fourth perovskite which is recrystallized. The perovskites in the subpixels arranged beside one another herein have different absorption properties, as shown for example in FIGS. 23 and 24.

Herein, the structure 1.5 which has been applied above the electrode pixels 1.6 separates the different regions of the perovskites. The different regions can herein be read out by the transistors 1.7 and thus processed individually.

Figure 2:
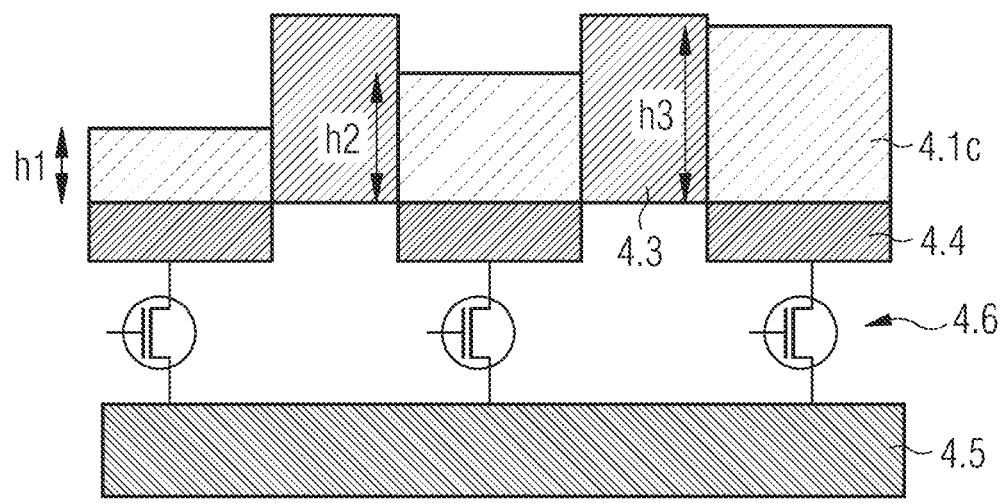
FIGS. 2 and 3 show schematic representations of detectors of the second embodiment according to the invention.
Figure 3:
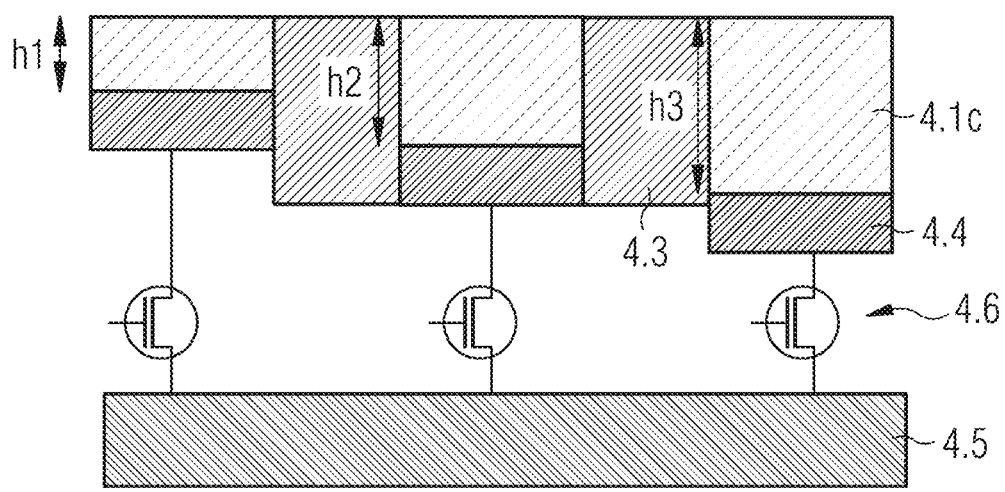

Detectors of the second embodiment are shown in FIGS. 2 and 3, wherein in an active matrix driving scheme, the electrode pixels 4.4 are arranged over the substrate 4.5 with transistors 4.6, for example, thin film transistors (TFTs). Arranged between the electrode pixels 4.4 are intermediate spaces, over which a structure 4.3 is arranged, in this case, for example, as a grid or walls. Arranged in the structure 4.3 is a first layer 4.1c, wherein this is filled over different electrode pixels 4.4 with different filling heights h1, h2, h3. Thus the filling heights h1-h3 of the subpixels are varied, but with the same absorber material. The subpixels with the lowest filling height h1 enable only the complete detection of low-energy photons. With increasing filling height, the absorbed proportion of high-energy photons increases. The correlation of the subpixel signals enables an item of spectral information. In FIG. 2, the upper edge of the first layer is on different planes which can lead to complex contacting of the individual subpixels with the second electrode. Another variant, which is shown in FIG. 3, is to place the electrode pixels 4.4 on different planes so that the upper edge of the first layer 4.1c lies on one plane.

In both embodiments of a detector according to the invention, the spectral information is obtained from the correlation of the electrode pixels (subpixels). The brightness values can be obtained via a weighted combination of the subpixel signals.

A further embodiment of the detector of the first embodiment (not shown) is provided by a combination of FIG. 1 with FIG. 2 or 3, as also described above.

By way of addition to the layer structures of the detectors as shown by way of example, in FIGS. 1 to 3, one or more interlayers, that is, electron-conducting and/or hole-conducting layers with electron or hole-conducting (or hole/electron-blocking) functions can be provided in the construction.

A third embodiment of the present invention relates to a method for producing a detector for electromagnetic radiation, in particular, an X-ray and/or gamma detector, comprising:

providing a first electrode layer comprising at least one first electrode pixel and a second electrode pixel as well as an intermediate space between the first electrode pixel and the second electrode pixel, applying a structure at least partially onto the intermediate space of the first electrode layer, wherein the structure is applied such that the structure is arranged on the intermediate space remote from the first electrode layer, wherein the structure separates a first region over the first electrode pixel from a second region over the second electrode pixel;

introducing into the structure a first layer comprising at least one first perovskite and a second layer comprising at least one second perovskite different from the first perovskite, wherein the first layer comprising at least one first perovskite is at least partially introduced into the structure such that it is situated over the first electrode pixel of the first electrode layer in the first region, and wherein the second layer comprising at least one second perovskite is introduced at least partially into the structure such that it is situated over the second electrode pixel of the first electrode layer in the second region; and applying a second electrode onto the structure and/or the first layer comprising at least one first perovskite and/or the second layer comprising at least one second perovskite; or providing a structure, wherein the structure has at least one intermediate space;

introducing a first electrode pixel and a second electrode pixel onto different sides of the intermediate space of the structure, wherein the first electrode pixel and the second electrode pixel do not fill the structure, and thereby forming a first electrode layer, wherein the structure separates a first region over the first electrode pixel from a second region over the second electrode pixel;

introducing into the structure a first layer comprising at least one first perovskite and a second layer comprising at least one second perovskite different from the first perovskite, wherein the first layer comprising at least one first perovskite is at least partially introduced into the structure such that it is situated over the first electrode pixel of the first electrode layer in the first region, and wherein the second layer comprising at least one second perovskite is introduced at least partially into the structure such that it is situated over the second electrode pixel of the first electrode layer in the second region; and applying a second electrode onto the structure and/or the first layer comprising at least one first perovskite and/or the second layer comprising at least one second perovskite.

According to particular embodiments, the introduction of the first layer comprising at least one first perovskite comprises an at least partial recrystallization of the at least one first perovskite and/or the introduction of the second layer comprising at least one second perovskite comprises an at least partial recrystallization of the at least one second perovskite.

A fourth embodiment of the present invention is directed to a method for producing a detector for electromagnetic radiation, in particular, an X-ray and/or gamma detector, comprising:

providing a first electrode layer comprising at least one first electrode pixel and a second electrode pixel as well as an intermediate space between the first electrode pixel and the second electrode pixel, applying a structure at least partially onto the intermediate space of the first electrode layer, wherein the structure is applied such that the structure is arranged on the intermediate space remote from the first electrode layer, wherein the structure separates a first region over the first electrode pixel from a second region over the second electrode pixel;

introducing at least partially into the structure a first layer comprising at least one first perovskite such that it is situated over the first electrode pixel of the first electrode layer in the first region and over the second electrode pixel of the first electrode layer in the second region, wherein a first filling height of the first layer comprising at least one first perovskite over the first electrode pixel in the first region differs from a second filling height of the first layer over the second electrode pixel in the second region; and applying a second electrode onto the structure and/or the first layer comprising at least one first perovskite; or providing a structure, wherein the structure has at least one intermediate space;

introducing a first electrode pixel and a second electrode pixel onto different sides of the intermediate space of the structure, wherein the first electrode pixel and the second electrode pixel do not fill the structure, and thereby forming a first electrode layer, wherein the structure separates a first region over the first electrode pixel and a second region over the second electrode pixel;

introducing at least partially into the structure a first layer comprising at least one first perovskite such that it is situated over the first electrode pixel of the first electrode layer in the first region and over the second electrode pixel of the first electrode layer in the second region, wherein a first filling height of the first layer comprising at least one first perovskite over the first electrode pixel in the first region differs from a second filling height of the first layer over the second electrode pixel in the second region; and applying a second electrode onto the structure and/or the first layer comprising at least one first perovskite.

According to particular embodiments, the introduction of the first layer comprising at least one first perovskite comprises an at least partial recrystallization of the at least one first perovskite.

According to particular embodiments, the steps in the method according to the invention are carried out in the order given.

With the inventive method, in particular, detectors according to the invention can be produced, that is, with the method of the third embodiment, detectors of the first embodiment, and with the method of the fourth embodiment, detectors of the second embodiment. Accordingly, the descriptions regarding detectors according to the invention according to particular embodiments relate also to the corresponding method according to the invention and vice versa. In particular, the different layers and materials for their production can be the same in methods according to the invention, which have already been described in relation to the detectors according to the invention, and also vice versa. It is advantageous in the methods according to the invention that they are easily scalable to large areas (e.g. 43×43 cm2).

Methods according to the invention of the third and fourth embodiment can initially comprise the steps:

I)—providing a first electrode layer comprising at least one first electrode pixel and one second electrode pixel as well as an intermediate space between the first electrode pixel and the second electrode pixel;

applying a structure at least partially onto the intermediate space of the first electrode layer, wherein the structure is applied such that the structure is arranged on the intermediate space remote from the first electrode layer, wherein the structure separates a first region over the first electrode pixel from a second region over the second electrode pixel;

or the steps

II)—providing a structure, wherein the structure has at least one intermediate space;

introducing a first electrode pixel and a second electrode pixel onto different sides of the intermediate space of the structure, wherein the first electrode pixel and the second electrode pixel do not fill the structure, and thereby forming a first electrode layer, wherein the structure separates a first region over the first electrode pixel and a second region over the second electrode pixel;

The methods can differ, for example, with regard to the production of the structure. Variant I) is advantageous, for example, in methods in which the structure is subsequently applied, for example with resists, in particular, photoresists or with 3D printing. Variant II), however, suggests itself for methods in which parts of a substrate, etc. are removed in order to produce a structure, for example, with etching or laser ablation, as described above.

Neither the provision of a first electrode layer in variant I), which can be designed as described above, nor the provision of a structure in variant II), which can also be designed as described above, for example, based upon a substrate, is specifically restricted. The formation of a structure in variant I) can take place as described above, for example, by applying resist, for example, photoresist, possibly multiple times and/or by 3D printing, etc. The introduction of the electrode pixels in variant II) can take place, for example, by introducing the material of the electrode pixels, as described above, into the region on different sides of the intermediate space or, in the case of more than two electrode pixels, between a plurality of "intermediate spaces" of the first electrode layer (which are thereby defined in these embodiments as above), for example, also onto contacts of a substrate, and liquefying and resolidifying (for example, melting and setting again), introducing the solid electrode pixels, solidification from the gas phase, vaporization from solution, etc., and is not specifically restricted, and can also take place from precursors of the electrode material, for example, during a precipitation. In the method of the fourth embodiment, the electrode pixels can be applied in different steps in order to achieve, for example, the structure of FIG. 3.

In the method of the third embodiment, the first layer and the second layer are then introduced, whereas in the method of the fourth embodiment, the first layer is introduced with different filling heights. These steps are also not specifically restricted. For example, the material for the first layer comprising at least one first perovskite and the material for the second layer comprising at least one second perovskite and possibly further materials for further layers comprising at least one further perovskite (in the method of the third embodiment) or the material for the first layer comprising at least one first perovskite (in the method of the fourth embodiment), for example, at least one corresponding perovskite material and/or its precursors, can be introduced as a powder into the structure and liquefied there and solidified again. The material composition introduced therefore does not have to correspond to the final composition of the final first layer. On introduction of precursors, after production of the at least one corresponding perovskite, it can also either be liquefied again and solidified again in order to recrystallize it. Herein, the at least one corresponding perovskite or the corresponding layer can be well connected to the structure and fastened thereon, since good wetting can take place by way of the liquid phase. The liquefaction is herein not specifically restricted and can take place, as described above with regard to the detector, by the influence of methalamine gas (MA gas), pressure and/or temperature. The solidification and thus the recrystallization can then correspondingly take place through the omission of the MA gas and/or a further corresponding temperature and/or pressure change, wherein these can be adapted to the at least one corresponding perovskite.

Figure 14:
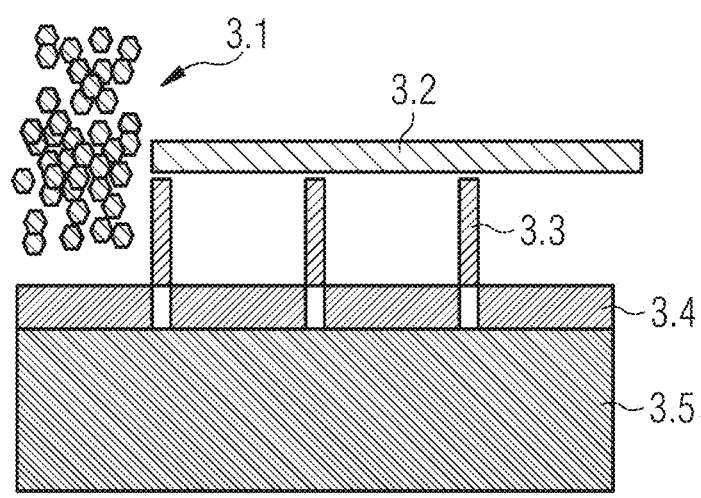
FIGS. 14 to 18 show schematic representations of an example method according to the third embodiment.

A corresponding method is shown schematically in FIGS. 14 to 18 for a method of the third embodiment. Situated on a substrate 3.5, as shown in FIG. 14, is a first electrode layer 3.4 comprising electrode pixels. Situated over the intermediate spaces of the first electrode layer 3.4 is a structure 3.3.

The material for the first layer is introduced into the structure 3.3 as a first powder 3.1, for example, as perovskite powder or as precursor materials for perovskite, as shown, by way of example, in FIG. 14. The introduction takes place in a targeted manner over an electrode pixel by way of a mask 3.2, wherein the e.g. perovskite powder falls through the mask openings into clearly defined regions over defined electrode pixels, wherein the mask 3.2 makes only one or a plurality of specific electrode pixels accessible. The perovskite material and/or the precursor material can be filled into these specifically placed openings.

Figure 15:
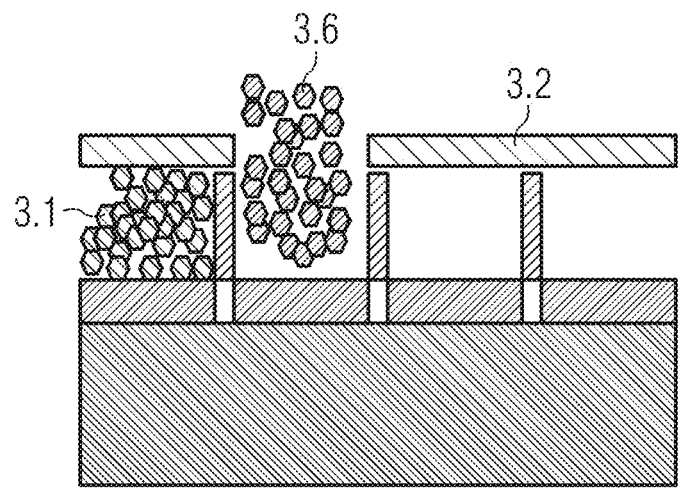

In a further step shown in FIG. 15, after adjustment or displacement of the mask 3.2 into another separate region over a further electrode pixel, a second powder 3.6 for the second layer is introduced, for example, as a perovskite powder or as precursor materials for perovskite. In the method of the third embodiment, the first and the second powder differ at least in respect of the perovskite or the precursor material. In a method according to the fourth embodiment, in place thereof, the first powder could again be filled with a different filling height.

Figure 16:
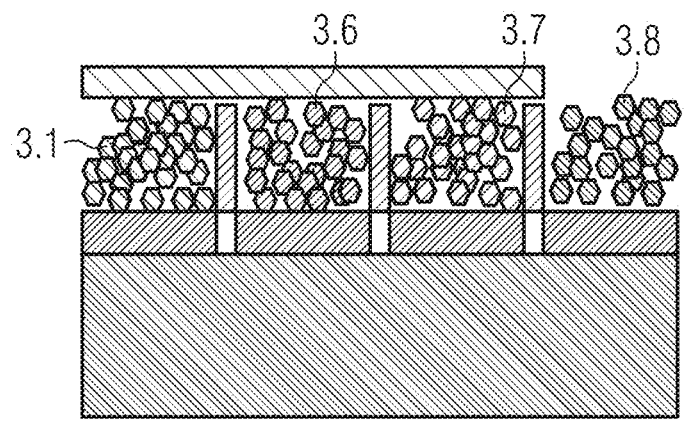

As FIG. 16 shows, subsequently a third powder 3.7 for a third layer, for example, as a perovskite powder or as precursor materials for perovskite, and a fourth powder 3.8 for a fourth layer, for example, as a perovskite powder or as precursor materials for perovskite is introduced.

Figure 17:
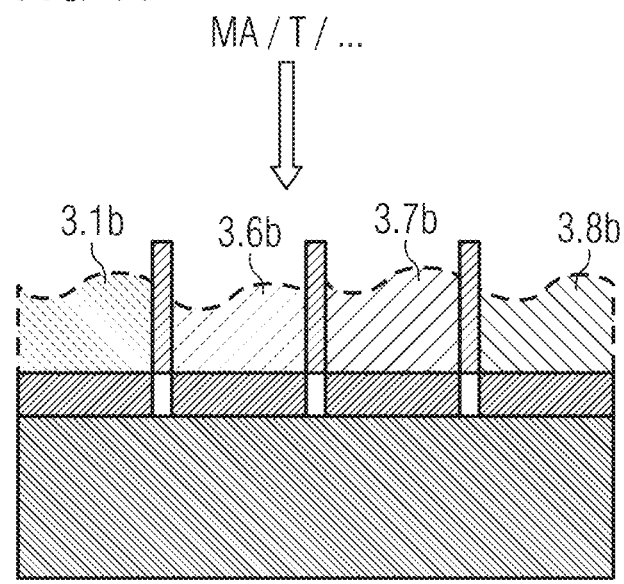

In the step shown in FIG. 17, the powders are subsequently liquefied by the action of MA gas, temperature T, etc., so that a liquid first layer 3.1b, a liquid second layer 3.6b, a liquid third layer 3.7b and a liquid fourth layer 3.8b are formed.

Figure 18:
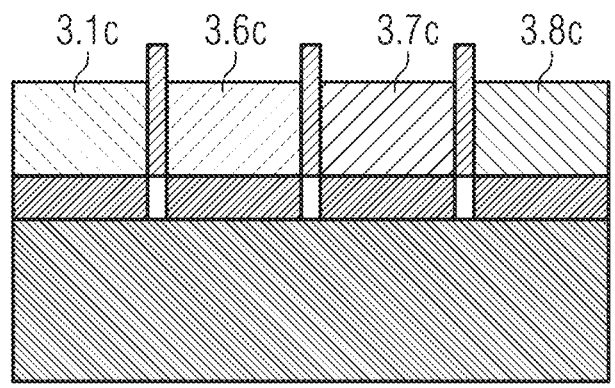

These are then recrystallized in the step shown in FIG. 18, in order to form a recrystallized first layer 3.1c, a recrystallized second layer 3.6c, a recrystallized third layer 3.7c and a recrystallized fourth layer 3.8c. These then have good adhesion on the first electrode layer 3.4 with a good electrical contact of the individual electrode pixels on the surface of the layer, for example greater than 60% of the area of the electrode pixel, preferably >80%, more preferably >90%, e.g. more than 95%, more than 99% or even 100%, and enables a spectral resolution in the detection of electromagnetic radiation, in particular X-ray and/or gamma radiation.

The process of filling the regions separated by the separating structures, the subsequent liquefaction and recrystallization can be repeated as often as needed until the desired filling height and layer property is achieved. Herein, different filling heights can also be produced.

After the application of the first and possible second and/or further layer, the second electrode is applied, wherein this is also not specifically restricted.

According to particular embodiments, in a method according to the invention, a layer comprising at least one scintillator is introduced at least between the structure and the second electrode. This can be configured as described above.

According to particular embodiments, in a method according to the invention, an electron-conducting and/or hole-conducting layer is introduced between the first electrode layer and the second electrode. This can be applied at a suitable site during the method, that is, onto the first electrode layer, the first and second and possible further layer or the first layer with different filling heights, the layer comprising at least one scintillator, etc., as set out above with regard to the detector. The materials of the layers correspond to those which have already been mentioned in connection with the detector.

According to particular embodiments, in a method according to the invention, the first electrode layer is applied to a substrate. This is not specifically restricted and can take place as described above in relation to the detector.

According to particular embodiments, in a method according to the invention, the substrate has a first and a second transistor, wherein preferably, the first electrode pixel is applied such that the first electrode pixel contacts at least the first transistor, and the second electrode pixel is applied such that the second electrode pixel contacts at least the second transistor.

Also disclosed is the use of a structure for separating layers comprising different perovskites or layers comprising at least one identical perovskite with a different thickness for spectral resolution in the detection of electromagnetic radiation, in particular X-ray and/or gamma radiation.

The above embodiments, configurations and developments can be combined with one another as desired, wherever useful. Further possible configurations, developments and implementations of the invention also include not explicitly mentioned combinations of features of the invention described above or in the following in relation to the example embodiments. In particular, a person skilled in the art would also draw upon individual embodiments as improvements or enhancements of the respective basic form of the present invention.

The invention will now be described in greater detail by reference to different examples thereof. However, the invention is not restricted to these examples.

Figure 25:
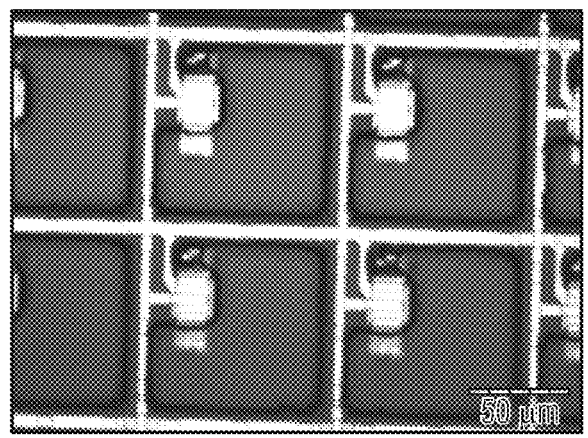
FIGS. 25 and 26 show images of detectors of examples of embodiments of the invention.
Figure 26:
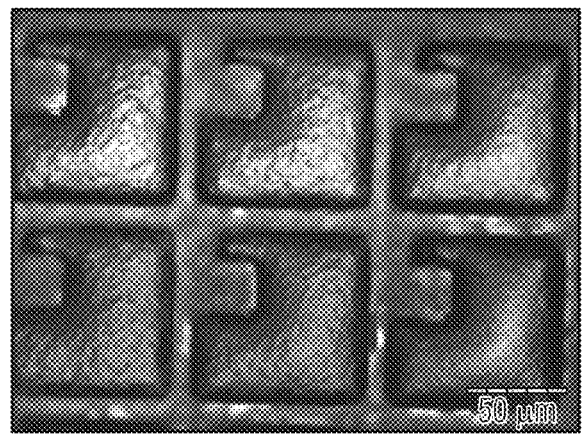
Figure 27:
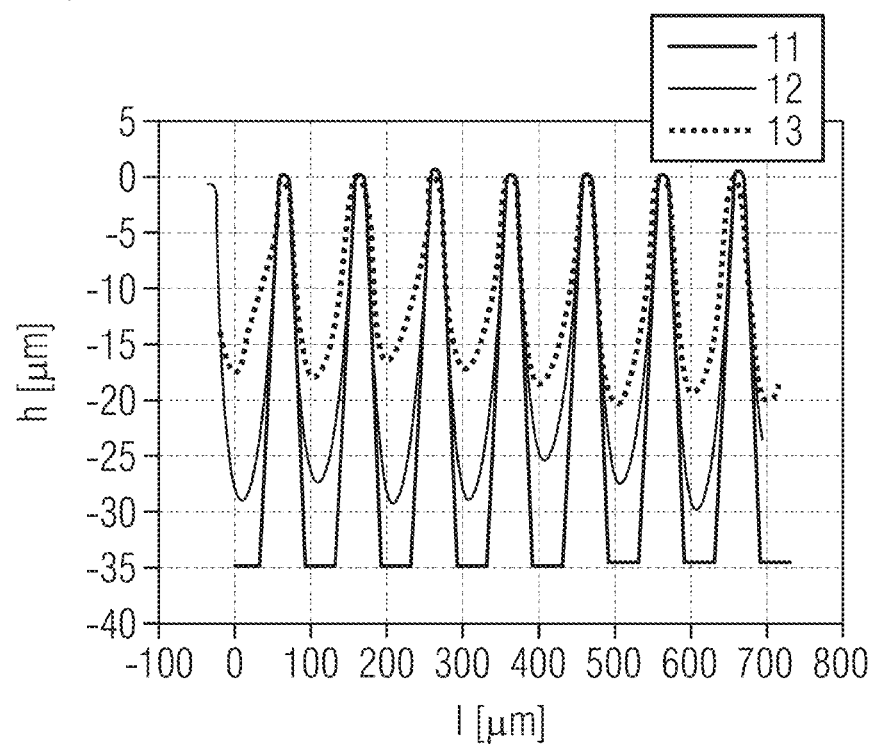
FIG. 27 shows a representation of the filling height of perovskite in a detector with a structure.

On a first electrode layer with electrode pixels made of, for example, ITO or Pt, a structure made from SU-8 as photoresist is formed between the electrode pixels according to FIG. 3. FIG. 25 shows an example grid of a pixelated substrate without a filling with perovskite. MAPI ($CH_3NH_3PbI_3$) as the perovskite in powdered form with varying filling height is introduced into the structure, liquefied with MA gas and recrystallized. FIG. 26 shows the grid with the filling and the pixel electrodes are filled. There follows multiple filling in order to achieve different filling heights. Shown in FIG. 27 are different filling heights as a profile of a grid, wherein the grid is shown without filling 11, the grid after the first filling 12, and the grid after the second filling 13. In the plot, the height profiles of the auxiliary structures are to be seen with a height of 35 µm after the filling in the 1st and the 2nd coating step. According to this example, the complete filling of the structure is achieved after approximately 3-4 coating steps, wherein this is not carried out for each electrode pixel. After completion of the filling, a second electrode made of Cr or Ti is applied to the MAPI.

Figure 28:
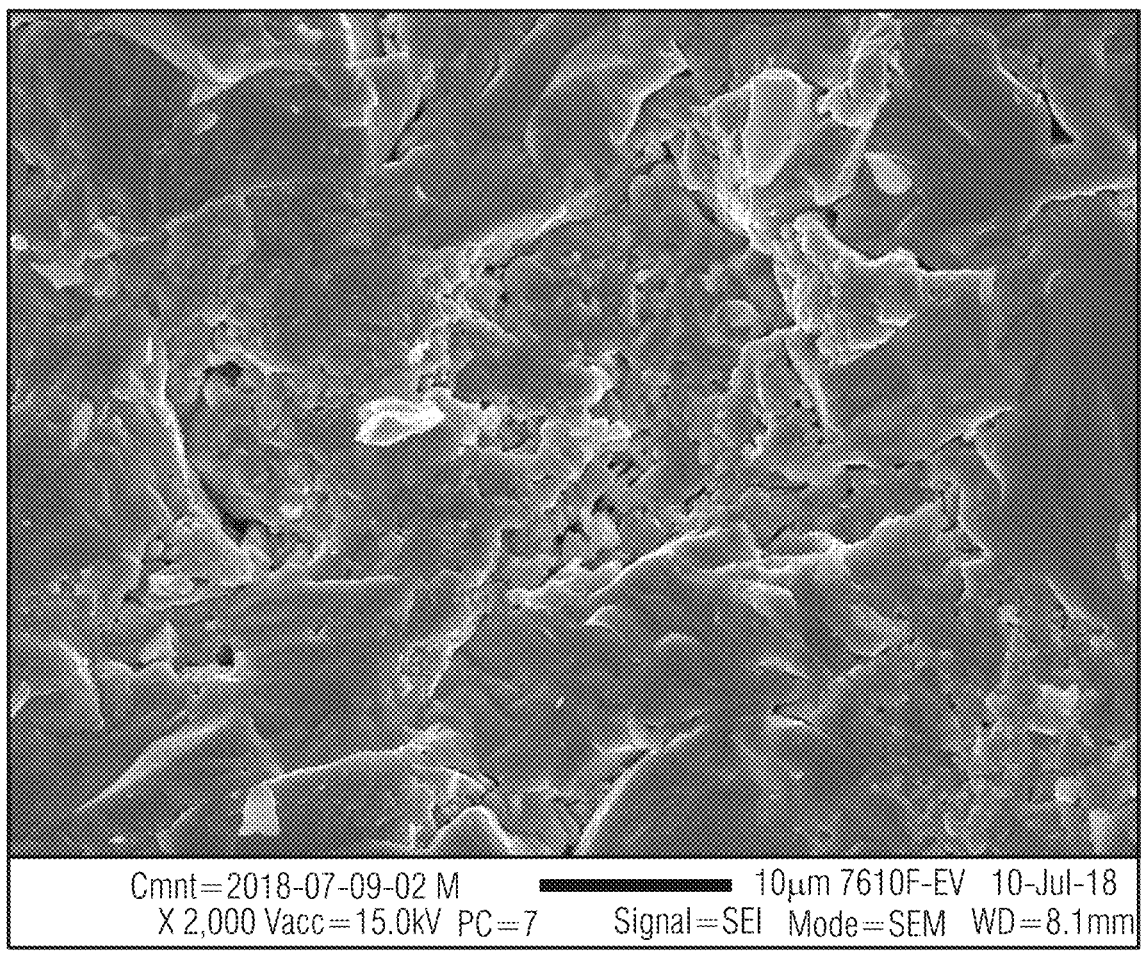
FIGS. 28 to 30 show SEM recordings of recrystallized perovskite, untreated and treated with MA gas.
Figure 29:
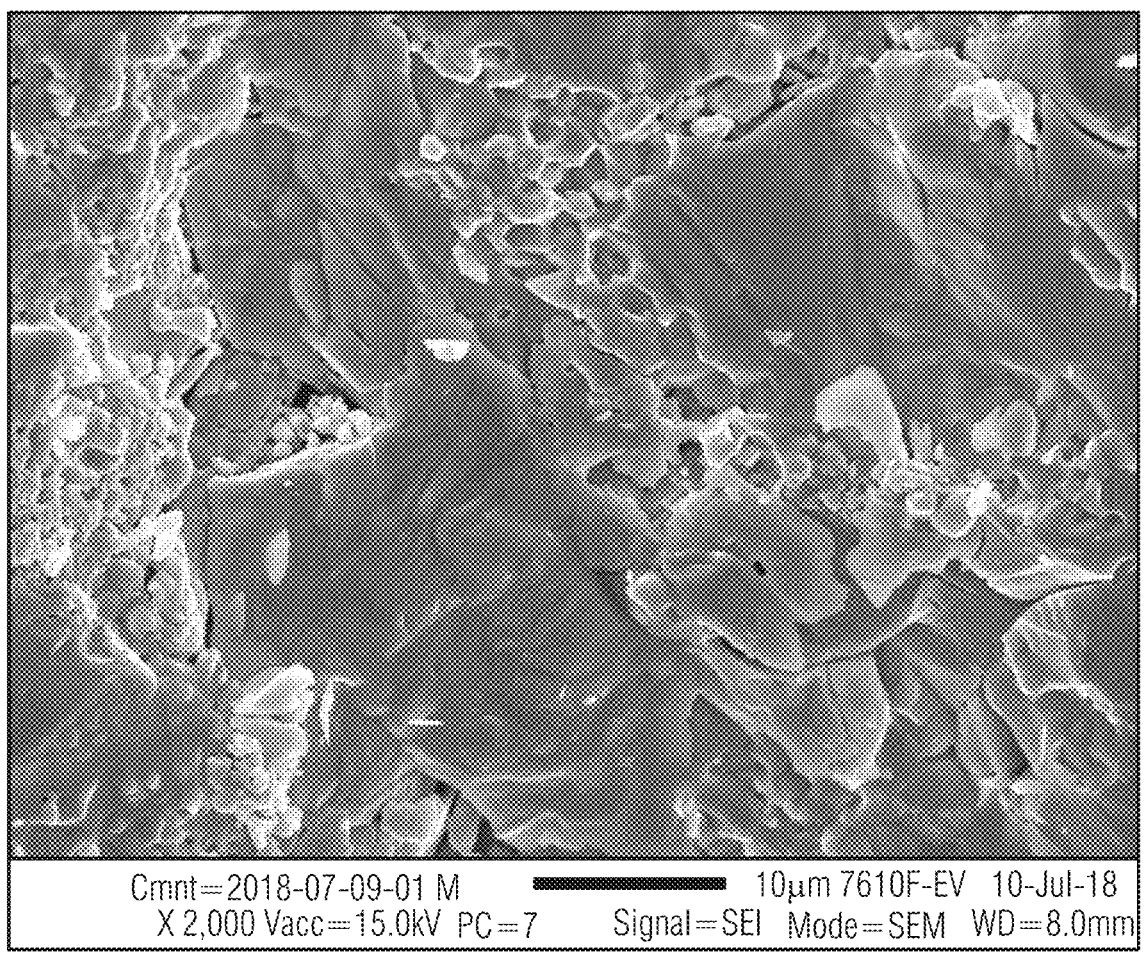
Figure 30:
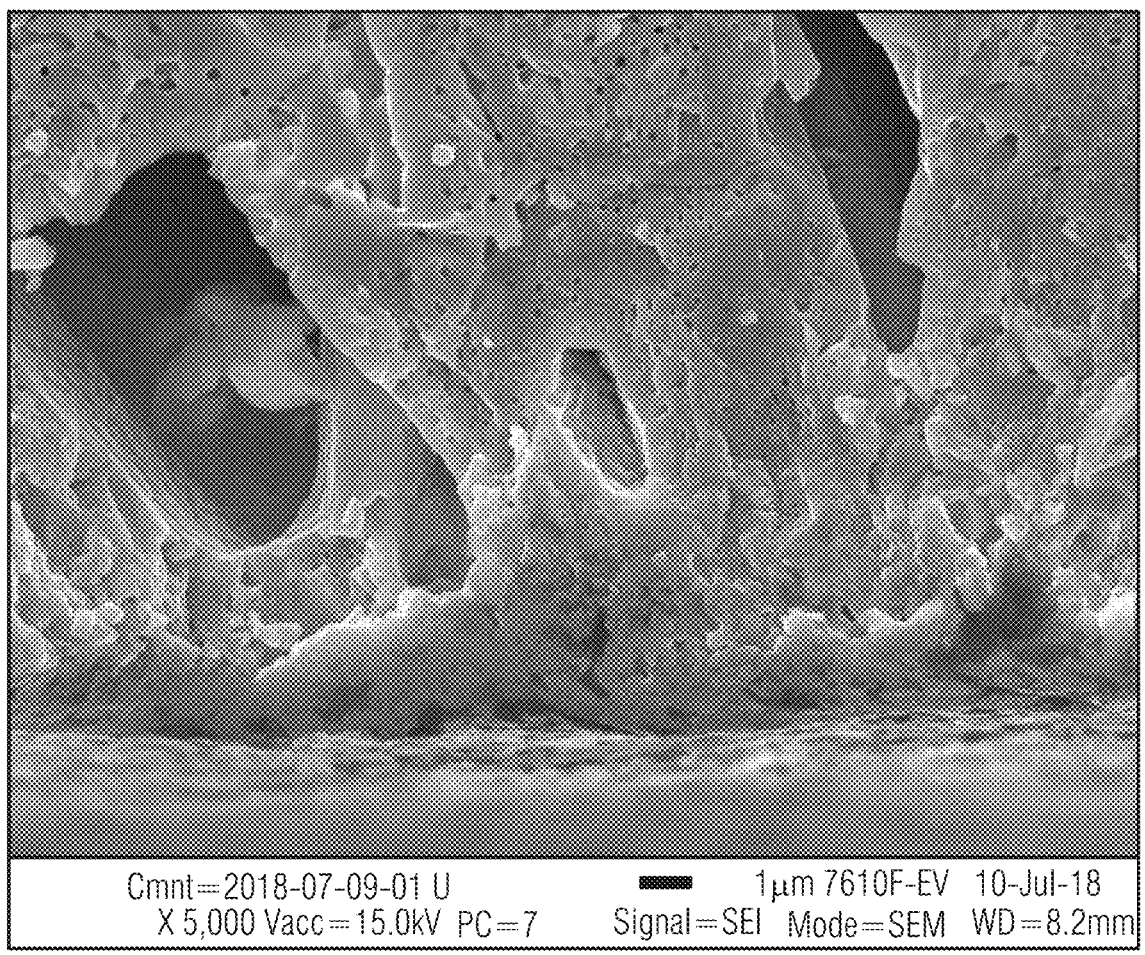

The SEM images in FIGS. 28 to 30 show the influence of MA gas on the recrystallization. Before the treatment, as shown in FIG. 28, there is a homogeneous structure with overwhelmingly primary grains approximately 5 μm in size and agglomerations thereof with a size of 10-30 μm. Following the surface treatment, a "compact" surface forms, as shown in FIG. 29, so that the chemical reaction gradually becomes visible, but nevertheless, in the middle, a morphological change can then be observed, primarily due to fewer agglomerations than in FIG. 28. MA gas thus disintegrates the grain agglomerates and more small grains (also called primary grains) are visible. At the edge of the perovskite, small "emergence craters" arise, as shown in FIG. 30, when the MA gas "evaporates" from the material again after a certain time. In addition, the μ-porosity also increases.

With the present detectors and methods, different combinations of materials and/or layer thicknesses are possible, whereby coverage of a broad spectrum of photon energies/wavelengths for detection is possible. A critical thickness of layers can be achieved easily via a layer-by-layer structure. In addition, separation structures are also easily created and variable in height (depending upon their use). In particular, there results a simple structuring capability of different perovskite materials or different thicknesses of detection layers on the subpixel (electrode pixel) plane, in particular, without photolithographic processes, as well as a simple process for varying the filling height in the subpixels or a combination of different absorbing materials, which can be applied adjoining one another easily and rapidly through use of a mask. A use of filters is not necessary, but if required, is possible on different electrode pixels or is usable on different electrode pixels (subpixels). With the preferred liquefaction and recrystallization method, a good contacting with the electrode pixels results and a layer-by-layer process is possible so that the layer thicknesses are adaptable.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A detector for electromagnetic radiation, comprising:
   a first electrode layer including at least one first electrode pixel and a second electrode pixel, an intermediate space existing between the at least one first electrode pixel and the second electrode pixel;
   a second electrode;
   a first layer including at least one first perovskite, situated between the at least one first electrode pixel of the first electrode layer and the second electrode;
   a second layer including at least one second perovskite, different from the at least one first perovskite, situated between the second electrode pixel of the first electrode layer and the second electrode; and
   a structure, situated at least partially between the first electrode layer and the second electrode, and arranged between the at least one first electrode pixel and the second electrode pixel of the first electrode layer so as to be arranged at least partially in the intermediate space between the at least one first electrode pixel and the second electrode pixel in a direction of the second electrode remote from the first electrode layer,
   wherein the first layer including the at least one first perovskite is at least partially introduced into the structure in a first region so as to be situated over the at least one first electrode pixel of the first electrode layer,
   wherein the second layer including the at least one second perovskite is introduced at least partially into the structure in a second region so as to be situated over the second electrode pixel of the first electrode layer, and
   wherein the structure separates the first region and the second region.

2. The detector for electromagnetic radiation of claim 1, wherein at least one of the at least one first perovskite in the first layer and the at least one second perovskite in the second layer, is at least partially recrystallized.

3. The detector for electromagnetic radiation of claim 1, further comprising:
   a layer including at least one scintillator, situated at least between the structure and the second electrode.

4. The detector for electromagnetic radiation of claim 1, further comprising:
   at least one of an electron-conducting and a hole-conducting layer, situated between the first electrode layer and the second electrode.

5. The detector for electromagnetic radiation of claim 1, further comprising:
   a substrate on which the first electrode layer is situated.

6. The detector for electromagnetic radiation of claim 5, wherein the substrate includes a first transistor and a second transistor, and wherein the first transistor contacts at least the at least one first electrode pixel and the second transistor contacts at least the second electrode pixel of the first electrode layer.

7. The detector for electromagnetic radiation, of claim 1, wherein the detector is at least one of X-ray detector and a gamma detector.

8. A detector for electromagnetic radiation, comprising:
   a first electrode layer including at least one first electrode pixel and a second electrode pixel, an intermediate space existing between the at least one first electrode pixel and the second electrode pixel;
a second electrode;
a first layer including at least one first perovskite, situated between the at least one first electrode pixel of the first electrode layer and the second electrode, and between the second electrode pixel of the first electrode layer and the second electrode; and
a structure, situated at least partially between the first electrode layer and the second electrode and arranged between the at least one first electrode pixel and the second electrode pixel of the first electrode layer so as to be arranged at least partially in the intermediate space between the at least one first electrode pixel and the second electrode pixel in a direction of the second electrode remote from the first electrode layer,
wherein the first layer including at least one first perovskite is at least partially introduced into the structure so as to be situated over the at least one first electrode pixel of the first electrode layer in a first region and over the second electrode pixel of the first electrode layer in a second region,
wherein a first filling height, of the first layer including the at least one first perovskite over the at least one first electrode pixel in the first region, differs from a second filling height, of the first layer over the second electrode pixel in the second region, and
wherein the structure separates the first and the second region.

9. The detector for electromagnetic radiation of claim 8, wherein the at least one first perovskite in the first layer, is at least partially recrystallized.

10. The detector for electromagnetic radiation, of claim 8, wherein the detector is at least one of X-ray detector and a gamma detector.

11. The detector for electromagnetic radiation of claim 8, further comprising:
a layer including at least one scintillator, situated at least between the structure and the second electrode.

12. The detector for electromagnetic radiation of claim 8, further comprising:
at least one of an electron-conducting and a hole-conducting layer, situated between the first electrode layer and the second electrode.

13. A method for producing a detector for electromagnetic radiation, comprising:
providing a first electrode layer including at least one first electrode pixel and a second electrode pixel, an intermediate space existing between the at least one first electrode pixel and the second electrode pixel;
applying a structure at least partially onto the intermediate space of the first electrode layer, the structure being applied such that the structure is arranged on the intermediate space remote from the first electrode layer, and the structure separating a first region over the at least one first electrode pixel from a second region over the second electrode pixel;
introducing into the structure, a first layer including at least one first perovskite and a second layer including at least one second perovskite different from the first perovskite, the first layer including the at least one first perovskite being at least partially introduced into the structure so as to be situated over the at least one first electrode pixel of the first electrode layer in the first region, and the second layer including at least one second perovskite being introduced at least partially into the structure so as to be situated over the second electrode pixel of the first electrode layer in the second region; and
applying a second electrode onto at least one of the structure, the first layer including the at least one first perovskite and the second layer including the at least one second perovskite; or
providing a structure, the structure including at least one intermediate space;
introducing a first electrode pixel and a second electrode pixel onto different sides of the intermediate space of the structure, wherein the first electrode pixel and the second electrode pixel do not fill the structure, and thereby forming a first electrode layer, wherein the structure separates a first region over the first electrode pixel and a second region over the second electrode pixel;
introducing into the structure, a first layer including at least one first perovskite and a second layer including at least one second perovskite, different from the first perovskite, the first layer including at least one first perovskite being at least partially introduced into the structure so as to be situated over the at least one first electrode pixel of the first electrode layer in the first region, and the second layer including at least one second perovskite being introduced at least partially into the structure so as to be situated over the second electrode pixel of the first electrode layer in the second region; and
applying a second electrode onto at least one of the structure, the first layer including the at least one first perovskite and the second layer including the at least one second perovskite.

14. The method of claim 13, wherein at least one of
the introducing of the first layer including at least one first perovskite includes an at least partial recrystallization of the at least one first perovskite, and
the introducing of the second layer including the at least one second perovskite includes an at least partial recrystallization of the at least one second perovskite.

15. The method of claim 13, wherein a layer including at least one scintillator is introduced at least between the structure and the second electrode.

16. The method of claim 13, wherein further, at least one of an electron-conducting layer and a hole-conducting layer is introduced between the first electrode layer and the second electrode.

17. The method of claim 13, wherein the first electrode layer is applied to a substrate.

18. The method of claim 17, wherein the substrate includes a first transistor and a second transistor, and wherein the first electrode pixel is applied such that the first electrode pixel contacts at least the first transistor and the second electrode pixel is applied such that the second electrode pixel contacts at least the second transistor.

19. A method for producing a detector for electromagnetic radiation, comprising:
providing a first electrode layer including at least one first electrode pixel and a second electrode pixel, an intermediate space existing between the at least one first electrode pixel and the second electrode pixel;
applying a structure at least partially onto the intermediate space of the first electrode layer, the structure being applied such that the structure is arranged in the intermediate space remote from the first electrode layer, and the structure separating a first region over the at least one first electrode pixel from a second region over the second electrode pixel;

introducing at least partially into the structure, a first layer including at least one first perovskite, so as to be situated over the at least one first electrode pixel of the first electrode layer in the first region and over the second electrode pixel of the first electrode layer in the second region, a first filling height of the first layer, including the at least one first perovskite, over the at least one first electrode pixel in the first region, differing from a second filling height of the first layer over the second electrode pixel in the second region; and applying a second electrode onto at least one of the structure and the first layer including the at least one first perovskite; or providing a structure, the structure including at least one intermediate space;

introducing a first electrode pixel and a second electrode pixel onto different sides of the intermediate space of the structure, wherein the first electrode pixel and the second electrode pixel do not fill the structure, and thereby forming a first electrode layer, the structure separating a first region over the first electrode pixel and a second region over the second electrode pixel;

introducing at least partially into the structure a first layer including at least one first perovskite so as to be situated over the at least one first electrode pixel of the first electrode layer in the first region and over the second electrode pixel of the first electrode layer in the second region, a first filling height of the first layer, including the at least one first perovskite, over the first electrode pixel in the first region, differs from a second filling height of the first layer over the second electrode pixel in the second region; and applying a second electrode onto at least one of the structure and the first layer including the at least one first perovskite.

20. The method of claim 19, wherein the introducing of the first layer including the at least one first perovskite includes an at least partial recrystallization of the at least one first perovskite.

\* \* \* \* \*